(12) United States Patent
Davies et al.

(10) Patent No.: US 11,328,102 B2
(45) Date of Patent: May 10, 2022

(54) DIGITAL DESIGN TOOLS FOR BUILDING CONSTRUCTION

(71) Applicant: AECOM, Los Angeles, CA (US)

(72) Inventors: Gavin Miles James Davies, London (GB); Stephan Alexander Jones, Balsall Common (GB)

(73) Assignee: AECOM, Los Angeles, CA (US)

( * ) Notice: Subject to any disclaimer, the term of this patent is extended or adjusted under 35 U.S.C. 154(b) by 388 days.

(21) Appl. No.: 16/368,567

(22) Filed: Mar. 28, 2019

(65) Prior Publication Data

US 2019/0303512 A1 Oct. 3, 2019

Related U.S. Application Data

(60) Provisional application No. 62/726,064, filed on Aug. 31, 2018, provisional application No. 62/650,077, filed on Mar. 29, 2018.

(51) Int. Cl.
*G06F 30/13* (2020.01)
*G06N 20/00* (2019.01)

(52) U.S. Cl.
CPC .............. *G06F 30/13* (2020.01); *G06N 20/00* (2019.01)

(58) Field of Classification Search
None
See application file for complete search history.

(56) References Cited

U.S. PATENT DOCUMENTS

| | | |
|---|---|---|
| 2008/0027968 A1 | 1/2008 | Kfouri et al. |
| 2012/0109589 A1 | 5/2012 | Thompson et al. |
| 2014/0259596 A1 | 9/2014 | Senesac et al. |
| 2015/0234377 A1 | 8/2015 | Mizikovsky |

FOREIGN PATENT DOCUMENTS

WO WO 2017/001522 A1 1/2017

OTHER PUBLICATIONS

International Search Report and Written Opinion for PCT Application No. PCT/US2019/024924 dated Aug. 6, 2019 in 9 pages.

*Primary Examiner* — Syed A Roni
(74) *Attorney, Agent, or Firm* — Knobbe, Martens, Olson & Bear, LLP

(57) ABSTRACT

Systems and methods are disclosed for digital design tools. One example method comprises obtaining an electronic model of a structure, the electronic model including a objects, and the objects representing physical objects to be constructed. Dependencies between the objects are determined, with the determined dependencies indicating that a first object is to be constructed prior to a second object. Construction orderings are generated based on the determined dependencies, with each construction ordering indicating a unique order in which the objects are to be constructed. A user interface is presented via a user device describing the construction orderings, with a system being configured to trigger updates to the electronic model in response to received material changes associated with the electronic model.

20 Claims, 10 Drawing Sheets

DIGITAL DESIGN TOOLS FOR BUILDING CONSTRUCTION

CROSS-REFERENCE TO RELATED APPLICATIONS

Any and all and all applications for which a foreign or domestic priority claim is identified in the Application Data Sheet as filed with the present application are hereby incorporated by reference in their entirety under 37 CFR 1.57.

FIELD OF THE DISCLOSURE

The described technology described technology generally relates to computer technology and, more specifically, to computer aided design.

BACKGROUND

Modern day construction of structures, such as commercial multi-story buildings, involves tight control of multitudes of different variables. Commonly, a construction entity may separate construction into discrete tasks which may be performed in series. For example, a first task may include excavation of an area on which a building is to be constructed. In this example, a second task may then include pouring of a foundation. An example of defining tasks may include an electronic Gantt chart indicating dependency relationships between tasks and current status. However, as irregularities or material changes arise during construction (e.g., a column being poured incorrectly), designers may have to manually adjust aspects of the defined tasks. Given the relative inflexibility of the electronic Gantt chart, it may be difficult to ascertain the optimal changes to construction that should be made.

Additionally, particular tasks may benefit from being separated, while other tasks may benefit from being combined. However, the electronic Gantt chart may mask these opportunities to improve the construction process. Furthermore, each task may indicate particular objects that are to be constructed. For example, a task to construct a portion of a building may include constructing all objects (e.g., columns, beams, walls) that are associated with the portion. Thus, for each task there may be multitudes of different schemes to construct the indicated objects. For example, the indicated objects may be constructed in multitudes of different orderings. Once a structure has been designed, users may review the structure, and flag (e.g., via user input to a user interface) portions which appear to be incorrect. For example, a user may utilize a user interface to manually review the structure, and indicate an incorrect object. However, given the quantity of objects that are included in the designed structure, it may be difficult or impossible to fully examine the designed structure via the user interface.

SUMMARY OF THE DISCLOSURE

Described herein are systems and methods for improved computer-aided design tools utilized for infrastructure construction. As will be described, a first example tool may be utilized by a user to intelligently design a structure. In this specification, a structure may comprise a building, infrastructure project, environmental project, and so on. The first example tool may control design applications to generate a design solution based on inputs and/or requirements captured by the first example tool. A second example tool may then automatically determine, and output in easy to visualize user interfaces, an order in which each object is to be constructed. An object may include any component, structure, and so on, that forms part of a designed structure which is to be constructed. Example objects may include a column, wall, and so on. A third example tool may utilize machine learning techniques to identify, or otherwise flag, anomalous design or engineering choices. For example, a system may be trained using prior construction designs based on supervised or unsupervised learning techniques. The system may therefore analyze a designed structure, and determine whether anomalies are existent in the structure. Example anomalies may include aesthetic anomalies, maintainability anomalies, building standard anomalies, engineering or construction anomalies, and so on. For example, anomalies may encompass missing objects, unconnected objects, unexpected objects, missing characteristics, duplicate objects, incorrectly sized objects, orientation anomalies, unpleasing aesthetics, excessive separation (e.g., between objects).

As will be described, detection of anomalies may filter solution options or adjust input parameters, such that redesigns of the structure may be triggered. In this way, the first example tool may enable generation of design options for evaluation, and the resulting options may be rationalized based on construction time (e.g., utilizing the second example tool) and/or in terms of quality (e.g., utilizing the third example tool).

With respect to the first tool, particular tasks associated with designing structures may be rapidly defined. For example, a user may receive design requirements and constraints, and rapidly import them to generate tasks to design a structure satisfying the preferences and constraints. Example tasks may include designing a building aesthetic, an electrical system, a water collection system, and so on. As will be described, a user may, in some embodiments, select from among templates of tasks to rapidly satisfy preferences and constraints. A selected template may be utilized to indicate an initial scope of tasks associated with designing a structure. The template may additional indicate perquisites associated with tasks. Default parameters may be employed, such that a design solution may be viable. However, it may be appreciated that certain default parameters may be overridden according to user requirements. As will be described, the system may update the tasks accordingly. For example, the user may prefer that a certain type of material be utilized for a particular type of object. In this example, the system may cause validation of the tasks based on this updated type of material. Additionally, tasks may be intelligently separated or combined, such that dependencies between tasks can be limited. In this way, tasks may be capable of being performed in parallel.

Furthermore, users (e.g., designers) may be assigned tasks, and thus can be responsible for executing their assigned tasks. Advantageously, a system described herein can validate whether all prerequisites of a particular task have been satisfied prior to triggering one or more users to initiate the particular task. The prerequisites may, as an example, be described in machine readable code which can be executed as queries against a three-dimensional electronic design model. As an example of validation, the system can access an electronic model of a structure and determine that the prerequisites have been satisfied. In this example, the electronic model may be a Building Information Modeling (BIM) model, and the particular task may relate to constructing a rainwater system. The system can determine, based on the electronic model, that the piping to which the rainwater system connects has been successfully designed. Thus, the system can intelligently cause the initiation, and validation, of tasks.

The first tool may therefore enable users to quickly design structures via the rapid definition and assignment of tasks. The second tool described herein, referred to herein as the construction scheduler, may utilize an electronic model of a structure to determine (e.g., optimize) an order in which objects of the structure are to be built. To determine the order, the second tool can determine dependencies between objects. As an example, a dependency may arise from a slab (e.g., cement slab) being constructed on top of a column. In this example, building the slab depends on having previously built the column. As will be described, the system can determine a dependency matrix indicating dependencies of all objects being constructed.

Thus, the dependency matrix can inform an order in which each object can be constructed. However, there may be an inordinate number of such construction orderings (e.g., trillions of orderings). The second tool can therefore determine one or more construction orderings that are advantageous or otherwise satisfy particular constraints input by a user. An example constraint may relate to a construction time. The system can determine a particular construction order that is expected to result in less than a specified construction time. This determined construction order can then be presented to a user.

Additionally, to reduce processing time, and thus to increase responsiveness when servicing multitudes of users, the system can intelligently reduce a number of possible construction orderings. For example, and as will be described in more detail below, the system may utilize directionality to reduce the number. In this example, the system may eliminate construction orderings that do not generally follow construction along a first direction and/or second direction. As an example, the system may determine construction orderings that cause construction to move from north to south and from west to east. As another example, the system may determine construction orderings that cause construction to move in a circular fashion. These determined construction orderings may then be analyzed, and presented to the user.

As will be described, the system may perform simulations of the construction orderings, and present information indicating estimated times for completions of the constructions orderings. Furthermore, a user may specify a particular completion time, and the system may determine whether any construction orderings may satisfy the completion time. Advantageously, the system may, on simulation result evaluation, trigger a design update that may loop until a required solution is determined in the form of a reduced completion time. Advantageously, machine learning techniques may be leveraged to determine this solution.

As described above the third tool, referred to herein as the anomaly detector, can utilize machine learning to detect various anomalies that may be included in an electronic model. In contrast to prior schemes that relied upon complex series of user-defined rules to detect violations, machine learning can increase effectiveness of anomaly detection and reduce reliance upon user interaction. For example, an example rule may be applied to identify any hallways with threshold width less than a specified value (e.g., 1 meter, 1.2 meters, and so on). A system may apply the example rule to electronic models, and flag any hallways that violate the example rule. However, there may be thousands, tens of thousands, and so on, of these rules which all need to be (1) defined by a user and (2) ensured to be consistently accurate and not contradicting one or more other rules. Thus, a great burden may be placed on users to write rules and determine when applicable to detect anomalies.

In contrast to the above scheme, machine learning models may be trained to automatically identify anomalies. For example, the system described herein may have empirically trained machine learning models, for example trained using supervised or non-supervised learning techniques. Furthermore, the machine learning models may be updated over time to automatically increase their accuracy. The additional training may also be utilized to learn new or rare anomalies that are to be flagged for further review by users. As will be described below, the system may automatically trigger an updated design based on detecting one or more anomalies. For example, the system may cause users to address the anomalies, or may automatically update the electronic three-dimensional model for particular anomalies (e.g., the system may increase a width of a hallway automatically by referencing the design task in example tool one, such that the consequences of change are correctly choreographed). Optionally, the system may identify one or more tasks associated with designing a portion of the electronic model in which the anomalies are included. The system may then transmit notifications to users which indicate that the tasks, and optionally any prerequisites, are to be completed to remove the anomalies.

The systems and methods described herein therefore improve the functioning of the computer and address technological problems. For example, the techniques described herein improve upon optimal solution design processes. In contrast to prior systems, which may rely on manual or inefficient design processes, the techniques described herein provide a holistic scheme to rapidly determine constructible design solutions (e.g., optimal constructible design solutions). While prior design schemes may utilize tasks to distinguish between discrete design portions, the tasks are merely statically defined (e.g., in a Gantt chart). Additionally, the tasks may, as an example, not be triggered for assignment based on a status of prerequisite tasks. For example, the system described below can advantageously validate prerequisites via analyzing an electronic model of a structure. The system may feed the outputs of one design task as inputs into other design tasks.

As described above, the system described herein can automatically determine one or more construction orderings of objects, and present the construction orderings to a user. The system may, in some embodiments, be associated with a web application servicing requests related to hundreds, thousands, tens of thousands, and so on, construction projects. Thus, to limit an extent to which users may have to wait for responses, the system can advantageously utilize particular logic and schemes to reduce processing associated with determining construction orderings.

Furthermore, the technical schemes described herein may reduce required user interactions and input to design an electronic model, evaluate and/or detect anomalies in the electronic model, and determine construction orderings which satisfy one or more constraints (e.g., determine an optimal order in which to build objects in the electronic model). As an example, the system may receive particular constraints associated with a construction project (e.g., a time constraint) and can automatically adjust an electronic model of the construction project until the constraints are satisfied. In this way, to arrive at a functional electronic model the user may be required to provide a minimal set of information to the system. User interfaces described herein may improve upon prior user interfaces utilized for construction design and planning. For example, the user interfaces may enable a quick drag-and-drop selection of particular tasks (e.g., templates of tasks) associated with designing a structure. As another example, the user interfaces may enable re-use of prior generated electronic models which may be automatically modified according to received constraints.

These easy to utilize user interfaces may therefore improve efficiencies associated with such construction design and planning software. Users may utilize the user interfaces to easily view an order in which each object is to be constructed. In this way, all users may quickly ascertain a current progress associated with the construction. As will be described, the user interfaces may respond to queries from users. For example, a user may provide a query regarding a remaining construction time. As another example, the user may provide a query indicating a material change to a design. The system can determine how the material change affects the design, and update the user interfaces to describe any updates. In this way, if it is determined that a new portion of a building is to be constructed, the system can determine how the objects included in this new portion are to be constructed. For example, an order in which the objects are to be constructed may be presented. In this way, the system can provide easily digestible information via responsive user interfaces.

Accordingly, in various embodiments, large amounts of data are automatically and dynamically calculated interactively in response to user inputs, and the calculated data can be efficiently and compactly presented to a user by the system. Thus, in some embodiments, the user interfaces described herein are more efficient as compared to previous user interfaces in which data is not dynamically updated and compactly and efficiently presented to the user in response to interactive inputs.

Further, as described herein, the system may be configured and/or designed to generate user interface data useable for rendering the various interactive user interfaces described. The user interface data may be used by the system, and/or another computer system, device, and/or software program (for example, a browser program), to render the interactive user interfaces. The interactive user interfaces may be displayed on, for example, electronic displays (including, for example, touch-enabled displays).

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to any systems and/or devices that could benefit from a mixer with improved linearity. The detailed description and drawings are merely illustrative of the disclosure rather than limiting, the scope of the disclosure being defined by the appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Additional embodiments of the disclosure are described below in reference to the appended claims, which may serve as an additional summary of the disclosure.

In various embodiments, systems and/or computer systems are disclosed that comprise a computer readable storage medium having program instructions embodied therewith, and one or more processors configured to execute the program instructions to cause the one or more processors to perform operations comprising one or more aspects of the above- and/or below-described embodiments (including one or more aspects of the appended claims).

In various embodiments, computer-implemented methods are disclosed in which, by one or more processors executing program instructions, one or more aspects of the above- and/or below-described embodiments (including one or more aspects of the appended claims) are implemented and/or performed.

In various embodiments, computer program products comprising a computer readable storage medium are disclosed, wherein the computer readable storage medium has program instructions embodied therewith, the program instructions executable by one or more processors to cause the one or more processors to perform operations comprising one or more aspects of the above- and/or below-described embodiments (including one or more aspects of the appended claims).

BRIEF DESCRIPTION OF THE DRAWINGS

The following drawings and the associated description herein are provided to illustrate specific embodiments of the disclosure and are not intended to be limiting.

DETAILED DESCRIPTION

Figure 1:
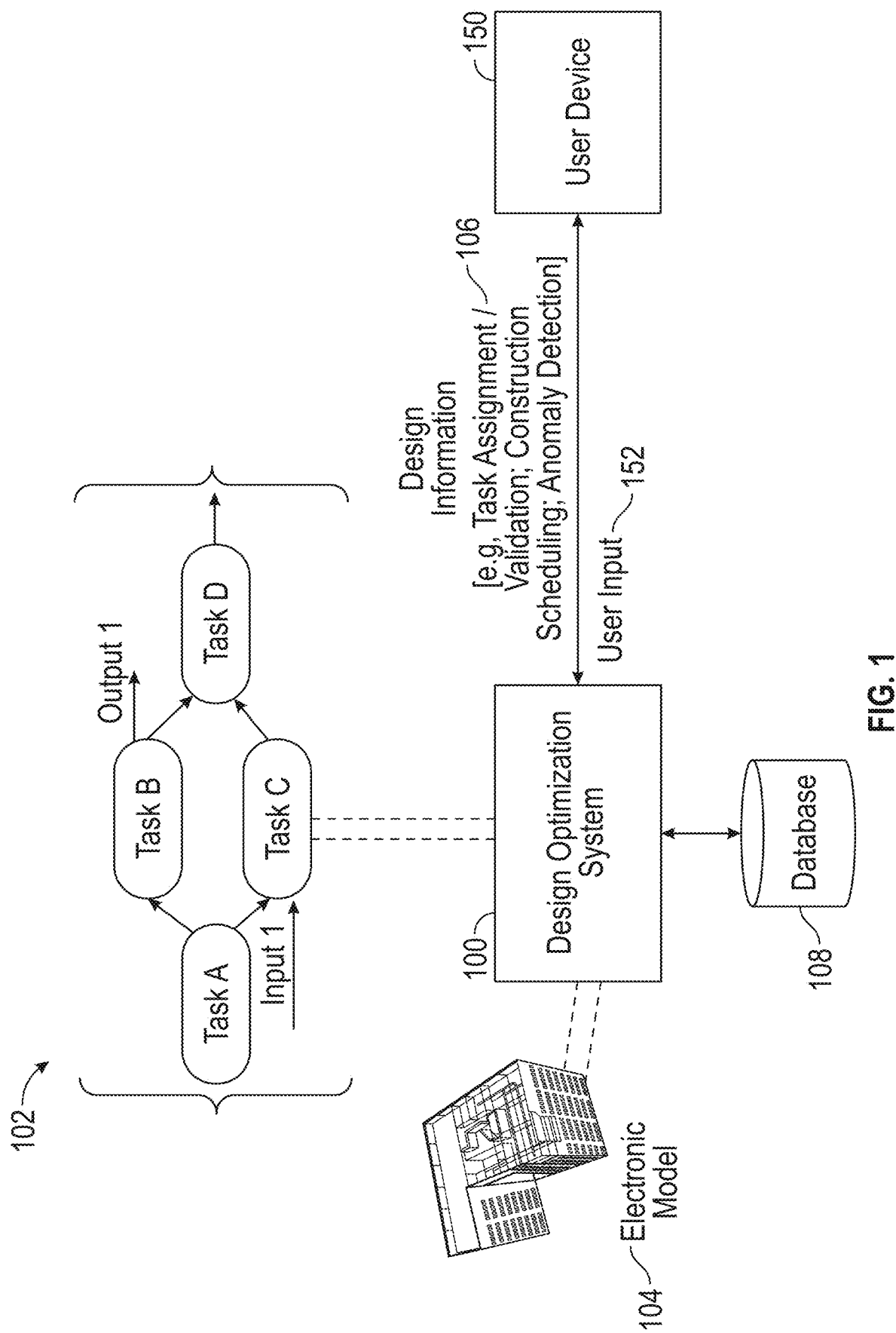
FIG. 1 illustrates a block diagram of an example design optimization system in communication with an example user device.

This specification describes schemes for enhanced construction planning and design. As will be described in more detail, a system described herein (e.g., the design optimization system 100) can provide disparate functionality related to (1) designing of structures and (2) determining specific construction details. In some embodiments, the system may provide one or more web applications for presentation on user devices, and respond to user input received via the presented web applications. In this way the system can store information related to multitudes of construction projects, and different users may utilize the web applications.

Definitions

In order to facilitate an understanding of the systems and methods discussed herein, a number of terms are defined below. The terms defined below, as well as other terms used herein, should be construed broadly to include the provided definitions, the ordinary and customary meaning of the terms, and/or any other implied meaning for the respective terms. Thus, the definitions below do not limit the meaning of these terms, but only provide exemplary definitions.

Task: As used herein, a task may relate to a portion of a design process towards completion of designing a structure. It should be understood that a structure may encompass any structure or infrastructure being designed. For example, a task may include a specific system or subsystem. Examples of tasks may include any aspect of a constructed infrastructure entity, such as an electrical system, wiring included in a structure, plumbing included in a structure, an elevator shaft, designing a stairwell, and so on. Additionally, a task may relate to actions required in a design process, such as handling zoning issues, filing of paperwork, and so on.

Each task may indicate particular prerequisites for initiation of the task. For example, an example task may relate to designing a water collection system. The example task may require that one or more prior tasks be completed, for example a task regarding designing water pipes. Each task may further indicate particular outputs. For example, an output may include generation of a document, updating of an electronic design model, and so on.

As will be described below, with respect to at least FIG. 1, a task may be included a precedence network of tasks. A precedence network may indicate dependencies between tasks, and may, in some embodiments, be a directed graph (e.g., a directed acyclic graph). Thus, particular tasks may be performed in parallel, while other tasks may require completion of prior tasks. The precedence network may, in some embodiments, be analyzed to identify whether any tasks can be combined or separated, thus potentially increasing, at least, parallelism in the precedence network.

Object:

As used herein, an object represents a portion of a structure that is to be constructed. For example, the portion can be a discrete portion of a structure. As an example, an object may include a wall, ceiling, column, beam, elevator shaft, wiring, or a portion thereof.

Electronic Model:

As used herein, an electronic model represents a model of a structure. The electronic model can indicate objects which are to be constructed. In some embodiments, the electronic model may indicate objects which will be deconstructed/disassembled or which are temporary. For example, an electronic model may be a Building Information Modeling (BIM) model. An electronic model may include three-dimensional information and may therefore represent a scale model of a structure being designed or constructed. In some embodiments, an electronic model may include four, or five, dimensional information. As an example, the electronic model may include metadata related to objects indicated in the electronic model. For example, an object may be a particular column and the metadata may indicate a type of column, a material from which the column is to be constructed, and so on. Additionally, the electronic model may indicate cost information, time information, resource information, and so on.

Construction Ordering:

As used herein, a construction ordering represents a determined order in which objects are to be constructed. For example, the construction ordering may indicate that a particular column is to be constructed first and a particular beam is to be constructed subsequently. In this example, the beam may be placed on top of the column and therefore may need to be constructed after the column. In some embodiments, the construction ordering may indicate that a multitude of objects may be constructed in parallel. With reference to the example above, the construction ordering can indicate that the particular column can be constructed at a same time as a different column. For example, the different column may have no dependencies related to the particular column.

Anomaly:

As used herein, an anomaly may represent an error, inconsistency, or unfavorable condition, associated with an electronic model. Additionally, an anomaly may indicate that a particular design choice is not expected or is otherwise outside an ordinary design. For example, if almost all hallways indicated in an electronic model are of a particular width, an anomaly may indicate that specific hallways are less than the particular width. While this anomaly may not represent an error, the anomaly may, in some embodiments, be flagged for review. Examples of anomalies may include aesthetic anomalies, maintainability anomalies, building standard anomalies, engineering or construction anomalies, and so on. As will be described, the anomalies may be automatically identified based on application of machine learning models.

User Input (Also Referred to Herein as "Input"):

As used herein in reference to user interactions with data displayed by a computing system, "user input" is a broad term that refers to any type of input provided by a user that is intended to be received and/or stored by the system, to cause an update to data that is displayed by the system, and/or to cause an update to the way that data is displayed by the system. Non-limiting examples of such user input include keyboard inputs, mouse inputs, digital pen inputs, voice inputs, finger touch inputs (e.g., via touch sensitive display), gesture inputs (e.g., hand movements, finger movements, arm movements, movements of any other appendage, and/or body movements), and/or the like. Additionally, user inputs to the system may include inputs via tools and/or other objects manipulated by the user. For example, the user may move an object, such as a tool, stylus, or wand, to provide inputs. Further, user inputs may include motion, position, rotation, angle, alignment, orientation, configuration (e.g., fist, hand flat, one finger extended, etc.), and/or the like. For example, user inputs may comprise a position, orientation, and/or motion of a hand and/or a 3D mouse.

Data Store:

Any computer readable storage medium and/or device (or collection of data storage mediums and/or devices). Examples of data stores include, but are not limited to, optical disks (e.g., CD-ROM, DVD-ROM, etc.), magnetic disks (e.g., hard disks, floppy disks, etc.), memory circuits (e.g., solid state drives, random-access memory (RAM), etc.), and/or the like. Another example of a data store is a hosted storage environment that includes a collection of physical data storage devices that may be remotely accessible and may be rapidly provisioned as needed (commonly referred to as "cloud" storage).

Database:

Any data structure (and/or combinations of multiple data structures) for storing and/or organizing data, including, but not limited to, relational databases (e.g., Oracle databases, mySQL databases, and so on), non-relational databases (e.g., NoSQL databases, Graph databases and so on), in-memory databases, spreadsheets, as comma separated values (CSV) files, eXtendible markup language (XML) files, TeXT (TXT) files, flat files, spreadsheet files, and/or any other widely used or proprietary format for data storage. Databases are typically stored in one or more data stores. Accordingly, each database referred to herein (e.g., in the description herein and/or the figures of the present application) is to be understood as being stored in one or more data stores.

This specification describes a system that enables users to rapidly design structures and determine construction details related to the designed structures. In this specification, a structure may include any residential or commercial structure. Example structures may include houses, sports stadiums, skyscrapers, museums, data warehouses, and so on. As will be described, the system may provide design and construction functionality through utilization of applications or software-based tools. As an example, the system may be associated with one or more web applications which users can utilize via user devices to interact with the system. While the description below indicates that three tools may implement disparate functionality, it should be understood that the techniques described herein may be combined into a same tool or software application. In some embodiments, the techniques described herein may be further separated into discrete tools or applications available for access or download by user devices. For example, an application (e.g., an 'app') may be obtained by a user device from an electronic application store.

It should be appreciated that designing structures can require multitudes of steps, with the steps being assigned to different designers with different specialties. These designers may initiate work on particular steps without a clear understanding of prerequisites that may be required for the steps or the current status of the prerequisites. With respect to a data warehouse, a designer may work on a design for an interior of the data warehouse. However, the interior may depend on the particular servers, or quantity of servers, being housed in the interior. For example, the particulars related to water cooling may impact an interior design. Thus, the designer may need to adjust the design of the interior depending on the design of water cooling, piping, and so on. These details may not be apparent from design planning that relies upon Gantt charts or statically defined diagrams.

As will be described below, with respect to at least FIGS. 2A-2B, the system can enable tasks to be defined with one or more prerequisites and one or more outputs. For example, a user may utilize a user interface described herein to specify particulars related to a task. In some embodiments, the user may utilize business process modeling notation (BPMN) or business process execution language (BPEL) to define each task. Example particulars may include a description of the task, specific prerequisites (e.g., inputs that are required to be validated), and specific outputs. The user may further indicate one or more users that are authorized, or otherwise allowed, to work on the task. As an example, users who belong to a specific design group or whose role relates to a specific design type may be authorized to work on the task. Each task may, in some embodiments, be indicated as a sub-task of a larger task. For example, a task associated with designing a kitchen in a restaurant may include designing particular kitchen stations, designing a gas or electrical system to power kitchen elements, and so on.

To increase a speed at which such tasks may be defined, and shared with different users, the system described herein may store previously defined tasks for inclusion in a current design process. For example, a user may specify a textual description associated with the current design. The system may analyze the textual description (e.g., using natural language process) to identify particular terms that relate to types of structures (e.g., skyscraper, restaurant, and so on). As another example, the system may present a user interface which presents selectable options indicating available types of structures. A user may provide user input to identify a type of structure being designed. Based on the type of structure, the system may, in some embodiments, present information identifying tasks commonly utilized (e.g., greater than a threshold number of times) for the type of structure. In some embodiments, the system may present tasks defined for all structures, and the user may select from among the tasks. For example, the user interface presented to the user may enable drag and drop functionality, such that the user may quickly assign tasks to the current design.

Since the defined tasks may indicate prerequisites and outputs, the system can generate, or otherwise obtain, a precedence network associated with the tasks. For example, the system may provide the defined tasks to a business process management (BPM) engine and obtain the precedence network. As described above, the precedence network may be a directed graph connecting the tasks together. Each user associated with designing a structure may have access to the precedence network and may thus share a common set of defined tasks and their dependencies.

As will be described, the system may initiate a first task in the precedence network and trigger notifications to users authorized to handle the first task. To complete the task, the users may indicate completion utilizing the system. In some embodiments, a threshold number of users may be required to confirm completion (e.g., a user may indicate completion, and another user may review the designed result and confirm completion). The system may access an electronic model and automatically validate that completion of the first task. For example, the electronic model may include geometric information associated with included objects. The system may analyze the outputs of the first task, and confirm that the outputs comport with the electronic model. An example output may include a design for a foundation of a structure. The system may analyze the electronic model and validate the included foundation.

Upon validation, the system may trigger notifications to users authorized to handle a subsequent task. In this way, the system may ensure that users initiate work on specific tasks when the tasks are ripe (e.g., when prerequisites for the task have been validated). Additionally, the system may automatically validate outputs associated with the tasks. In this way hundreds or thousands of users may traverse the same precedence network, performing work for specific design tasks when the tasks are ready to begin.

While the technical scheme described above may enable a rapid and efficient design process, the system may further improve the functioning of software related to implementing the physical construction. As will be described below, with respect to at least FIGS. 3A-3C, the system can analyze the designed electronic model and determine an order in which each object in the electronic model is to be constructed. For example, the system may obtain geometric information associated with each object, and may determine a dependency matrix indicating dependencies between the objects. As an example, the system may identify whether an object is supported by, or rests on, another object. As another example, the system may identify that an object has a top, side, bottom, dependency, or combination thereof (e.g., top and side). Examples of determining dependencies between objects will be described at least in FIG. 3A.

The system may store the dependency network, for example in a graph database, and may analyze the dependency network to generate different construction orderings. As will be described, the system may simulate these different construction orderings to determine estimates associated with time, cost, resource usage, and so on for the construction orderings. For example, the system may obtain information indicating completion times (e.g., average completion times) associated with each object (e.g., a type of object, such as a column). In this example, the system may determine a completion time for a structure.

In some embodiments, the system may access metadata information associated with the objects and utilize the metadata to determine a completion time for the structure. As an example, different objects may be made of disparate materials. These disparate materials may be associated with different completion times. As another example, connections between objects may have different tolerances depending on the structure (e.g., a chemistry lab may require air-tight connections between objects in certain locations). Similar to material type, these different tolerances may be associated with different completion times.

While the system may determine an optimal (e.g., shortest) completion time from the different construction orderings, as will be described the system may reduce a number of construction orderings that are required to be simulated. For example, the system may prefer construction orderings that follow particular directionality. As an example, the system may prefer construction orderings that cause construction to flow from north to south and east to west. Thus, the system may reduce required processing while preserving construction orderings that may be commonly followed by construction entities. This reduced number of construction orderings may be simulated, and thus an optimal (e.g., shortest) construction ordering may presented to a user.

The system may further analyze electronic models and determine anomalies within the electronic models. For example, and as will be described in more detail below with respect to FIGS. 4A-5B, the system may utilize machine learning models to identify anomalies. Examples of machine learning models may include neural networks, k-means clustering, support vector machines, and so on. Unsupervised machine learning techniques may be utilized, for example the system may analyze training data sets (e.g., unlabeled data) and determine features in the training data sets appear to be anomalous. Additionally, supervised machine learning techniques may be utilized such that the system may be trained using labeled data. For example, these techniques may optionally be based on deep learning (e.g., artificial neural networks). In this example, one or more neural networks may be trained utilizing the label data to identify anomalies. Optionally, the neural networks may assign a probability associated with an object being anomalous. As the system receives and analyzes new electronic models, users may confirm, or deny, determined anomalies as being anomalous. In this way, the system may update its machine learning models to increase an accuracy at which anomalies can be determined.

In some embodiments, the system may update, or recommend updates for, an electronic model. For example, the system may determine a particular anomaly in the electronic model. The system may then analyze modifications commonly made to electronic models with a same, or similar anomaly. These modifications may be presented to a user as a recommendation, or the system may implement a modification. As an example, an anomaly may indicate that a stairwell does not have a door opening onto a hallway of a particular floor of a skyscraper. In this example, the system may determine that stairwells generally have openings onto all floors. Thus, the system may update the electronic model to include a door opening (e.g., the system may copy a door opening utilized on a different floor).

In this way, the system may improve upon software-based construction design and planning software. Users may leverage the functionality described above to rapidly generate designs. Additionally, users may specify particular constraints (e.g., construction time constraints, cost constraints, and so on), and the system may ensure these constraints are enforced. As an example, users may generate a design of a structure utilizing the design functionality described herein. The system may then determine construction orderings for the design. The system may simulate the construction orderings to then determine estimated construction times for the constructions orderings. If the construction times exceed a specified time-based constraint, the system may trigger information to the users indicating that updates are required to the design (e.g., to reduce the construction time).

FIG. 1 illustrates a block diagram of an example design optimization system 100 in communication with an example user device 150. The design optimization system 100 may be a system of one or more computers, one or more virtual machine executing on a system of one or more computers, and may be in communication with the user device 150 over a network (e.g., the internet). Additionally, the system may communicate with a database 104 or storage subsystem. As will be described, the design optimization system 100 can facilitate generation of a precedency network 102 that includes tasks towards completion of a design of a structure. Additionally, the design optimization system 100 can obtain, or enable generation of, an electronic model 104 of the designed structure. In response to user input 152 received from the user device 150, the design optimization system 100 can provide generated design information 106 to the user device 150. For example, the design information 106 may include user task assignments, task validation, construction scheduling, anomaly detection, and so on as will be described.

The design optimization system 100 may implement one or more web applications, which the user device 150 may access to perform the functionality described herein. For example, the design optimization system 100 can generate web page information for rendering on the user device 150. A user of the user device 150 can provide user input 152 directed to the rendered web pages, and the design optimization system 100 can update the web page information based on the user input 152.

In some embodiments, particular processing may be offloaded on to the user device 150, while other processing may be performed via the design optimization system 100. As an example, visual details included in a web application web page may be handled by the user device 150. In this example, the design optimization system 100 may generate information for inclusion in the web page (e.g., construction scheduling orderings, detected anomalies in an electronic model 104, and so on). In this way, the user device 150 may be a thin client or mobile device with limited processing power. The user device 150 may, in general, include a desktop computer, tablet, mobile device, wearable device, and may, in some embodiments, present augmented reality content obtained from the design optimization system 100 (e.g., a user may visualize the electronic model 104, anomalies in the model 104, and so on).

As illustrated in FIG. 1, a precedence network 102 includes examples tasks A-D. These tasks are connected (e.g., in a directed graph), and thus indicate an example order in which the tasks can be initiated. For example, task A is indicated as being a first task, while task D is indicated as being a last task. Tasks B and C are indicated as being parallel, such that different users or different design teams may initiate these tasks separately. As described above, each task may be related to a portion of a design process to design a structure. Thus, the tasks illustrated in FIG. 1 may each represent a distinct portion, and may be described with a textual description or tag. As an example, Task A may relate to designing a foundation for the structure. Additionally, the tasks may each be assignable to different users or different user roles. In the example described above, Task A may be assignable to users with specialties relating to foundations or structural integrity. As will be described, the design optimization system 100 may assign a task to one or more users based on validating that the task can be initiated.

The precedence network 102 may be provided for presentation to a user device 150. For example, the user device 150 may present an interactive user interface and the precedence network 102 may be included. Thus, the user can view details related to each task included in the precedence network 102. In the example of Task A described above, the user interface may present a textual description of Task A. In some embodiments, the textual description may be presented along with users who can perform the task, whether the task has been initiated, an amount of time for which work has been performed, estimated remaining time until completion of the task, and so on. In some embodiments, the user may interact with the user interface to request status updates related to a task, or cause notifications to be triggered to users assigned to the task requesting information.

The tasks in the precedence network 102 are illustrated as having prerequisites and outputs. For example, Task A is illustrated as outputting information to Task B and Task C. The first task, Task A, is illustrated as not having prerequisites. However, it should be understood that prerequisites may be input into Task A, such as legal paperwork, initial design plans, constraints, and so on. The design optimization system 100 may analyze these prerequisites and outputs, and determine the precedence network 102. For example, the system 100 may utilize a business process management (BPM) engine to determine the relationships between the tasks. The BPM engine may interpret the determined relationships and orchestrate tasks accordingly.

Additionally, Task C is illustrated as having a prerequisite that does not stem from a prior Task (e.g., Input 1). Thus, the design optimization system 100 may provide user functionality to define prerequisites as being obtainable from outside databases or systems. For example, Task C may relate to designing a water system for the structure. Input 1, in this example may therefore cause the design optimization system 100 to obtain city rules related to water flow for showerheads, bathroom fixtures, and so on. Thus, when defining Task C, a user may indicate that the system 100 is to obtain rule information. As an example, the design optimization system 100 may provide a request to a computer system associated with a city. As another example, the system 100 may perform a search (e.g., an internet search), and parse identified web pages for a result. In some embodiments, the system 100 may provide information to a database system storing such information (e.g., a knowledge graph system). In this way, the design optimization system 100 may reduce required user actions when performing a task. Additionally, Task B is illustrated as outputting information that is not directed to a subsequent task (e.g., Output 1). The design optimization system 100 may cause particular outputs to be presented to users, stored in one or more databases, transmitted to particular users or outside systems, and so on. For example, Output 1 may represent a document generated by users who completed Task B.

In some embodiments, the design optimization system 100 may enable users to select previously defined tasks for inclusion in their precedence network 102. As described above, a user interface presented on the user device 150 can include a listing of available tasks for inclusion. Users may select from among the listing and cause the importation of the tasks into their precedence network. In this way, actions of the users may be limited and efficiency in using such design software increased. When importing previously defined tasks, the design optimization system 100 can ensure that the prerequisites and outputs comport with other tasks included in the precedence network. For example, if a user drags a task related to designing a backup electrical system into the precedence network 102, the system 100 can ensure the task is subsequent to designing the core electrical system.

The design optimization system 100 may analyze tasks included in a generated precedence network 102, and recommend whether one or more tasks should be separated or combined. For example, the design optimization system 100 can analyze the outputs of each task (e.g., the deliverables) and identify whether certain deliverables have dependencies with each other. As an example, if Task B and Task C were combined, the system 100 may analyze the outputs of the combined task. In this example, the system 100 could determine that the multiple outputs do not depend on each other. Thus, the system 100 may recommend that the combined task be separated into sub-tasks (e.g., Task B and Task C), such that the outputs can be separately produced at a same time by different users.

As described above, users may indicate completion of a particular task assigned to the users. For example, a user of user device 150 may provide user input 152 to the design optimization system 100 confirming completion of a task. The design optimization system 100 may require one or more additional users to validate the completion. In some embodiments, the design optimization system 100 may perform the validation using information generated from the completed task. For example, the design optimization system 100 may analyze an electronic model 104 which was updated based on the task. As another example, the design optimization system 100 may analyze an electronic model 104 which may have been previously generated. In this example, the users may have an existent electronic model and the design process may relate to particulars of construction (e.g., construction details).

In the example above regarding analyzing the electronic model, the design optimization system 100 may determine whether an output produced via a task is consistent with the prerequisites to the task and the description of the task. As an example, a task may relate to designing a rainwater collection system. The design optimization system 100 can analyze the electronic model 104 to determine whether piping can adequately carry water to the collection system. For example, flow determinations may be performed in view of the length, area, and so on of the rainfall collection surface areas. In some embodiments, the system 100 may obtain information indicating expected, or maximal rain the collection system is to handle. This obtained information may be provided or obtained in response to initiation of a prior task. Thus, the design optimization system 100 can compare the result of the task to the electronic model 104 itself. In this way, the system 100 may automatically validate completion of the task.

Subsequent to completion of a task, the design optimization system 100 can trigger notifications to users that a subsequent task is to be initiated. In some embodiments, the design optimization system 100 may lock functionality to initiate a subsequent task until the system 100 validates the prior tasks. As illustrated, the system 100 may provide design information 106 to the user device 150. The design information 106 may include task assignment and validation information. For example, the design optimization system 100 may obtain information indicating users who are authorized to initiate the subsequent task. The system 100 may then provide information to the users authorizing the users to initiate work on the subsequent task. For example, the system 100 may cause an application the user device 150 to execute and present a notification. The notification, in this example, may cause presentation of details related to the subsequent task. As another example, the system 100 may provide emails, text messages, and so on.

As will be described in more detail below, the design optimization system 100 can generate a dependency matrix that describes dependencies between objects included in the electronic model 104. For example, the system 100 may apply one or more dependency rules to determine dependencies relating to each object. An example dependency rule for an object can include determining whether the object sits on top of another object or whether the object supports the other object. In addition to geometric dependencies, dependency may further indicate space or logical associations. An example of a logical association may be water tightness. Examples of dependencies are described below, with respect to FIGS. 3A-3B. The design optimization system 100 may store the dependency matrix in the database 104, which may, in some embodiments, be a graph database (e.g., a database that uses graph structures for semantic queries).

Based on this dependency matrix, the design optimization system 100 can determine multitudes of valid construction orderings. As described above, a construction ordering indicates an order in which objects can be built without violating any determined dependencies. While the description above has focused on a construction ordering indicating a linear order of objects, it should be understood that a construction ordering may include portions that are linearly connected and portions which may be constructed in parallel. For example, a non-load bearing wall may be built at any point during construction and thus may be constructed in parallel with other objects.

The design optimization system 100 can analyze each construction ordering and simulate the construction ordering. As described above, simulation can determine an estimated construction time for the construction ordering. The simulation may be based on average times to complete particular, or classes of, objects, average or actual quantities of resources a construction entity can access in a period of time, and so on. In some embodiments, the system 100 may determine an estimated cost associated with each construction ordering. The average cost may be based on a determined construction time for the construction ordering, labor costs (e.g., in a given city or market), material costs, and so on.

These simulations may be presented to the user device 150 in an interactive user interface. For example, summary information related to the simulations may be presented. While the summary information may be customized by a user, the summary information may include construction times, estimated costs, a combination of construction times and estimated cost (e.g., a weighted combination), and so on. The user may cause the summary information to be ordered, such that a shortest construction time or lowest estimated cost may be determined.

In some embodiments, the design optimization system 100 may obtain one or more constraints related to constructing the structure, and determine whether the simulations comport with the constraints. For example, a constraint may relate to cost or construction time. If the system 100 determines that no simulation satisfies the constraint it may trigger changes to be made to the electronic model 104. As an example, a task may be generated to reduce construction time (e.g., trim a number of objects, or otherwise modify the electronic model 104) and/or cost. In this way, the simulations may directly influence the design process (e.g., by testing alternate design options successively across the design systems and components).

Since there may be trillions of combinations of construction orderings, the design optimization system 100 may advantageously apply logic to reduce the number of combinations. As will be described in more detail with respect to FIG. 3, the system 100 may utilize directionality information to reduce the number. For example, the system 100 may filter construction orderings that do not follow a consistent building directionality pattern. As an example, the system 100 may remove construction orderings that do not cause a construction entity to build from south to north, shift from west to east, then build from north to south. The directionality examples described herein should not be considered exhaustive, and other examples may be incorporated. This reduction in the number of combinations can enable the system 100 to conserve resources, handle multiple requests with less lag, and so on.

In some embodiments, as a structure is being built the system 100 may receive user input 150 indicating a material change to the design of the structure. For example, during construction it may be desirable to add a new portion to the structure. As another example, a material change may relate to an object having been improperly constructed. The design optimization system 100 can trigger different actions based on the material change. An example action may include causing one or more tasks to be updated to alter the design of the structure with cascading recalculations on downstream dependent tasks. Another example action may include determining an updated construction ordering to correct the improperly constructed object. In this example, the system 100 can determine an order in which remaining objects are to be constructed given that the improperly constructed object will have to be re-constructed. The system 100 can then provide information to the user device 150 indicating the updated construction ordering.

Thus, a construction entity may monitor progress of a structure and obtain information indicating an optimal (e.g., lowest cost, lowest construction time, or a combination thereof) construction ordering. The user device 150 may present a user interface that describes the monitored progress. For example, the user interface may present remaining objects that are to be constructed, construction phases remaining, and so on. In some embodiments, the system 100 may receive camera information monitoring progress of the structure. The system 100 may determine, or obtain information (e.g., from an outside system), indicating progress of the structure. For example, as new columns or beams are constructed the system 100 can update the progress information presented on the user device 150.

The design optimization system 100 can further determine anomalies in the electronic model 104. As described above, the system 100 may utilize one or more machine learning models to determine inconsistencies, errors, or anomalies that differ from commonly accepted norms. Examples of determining anomalies will be described in more detail below, with respect to FIGS. 4A-5B. As described above, if an anomaly is detected the system 100 may trigger an update be made to the electronic model 104. For example, one or more tasks may be triggered which are associated updating the design. These updated designs may then be analyzed by the system 100, and any anomalies flagged.

Figure 2A:
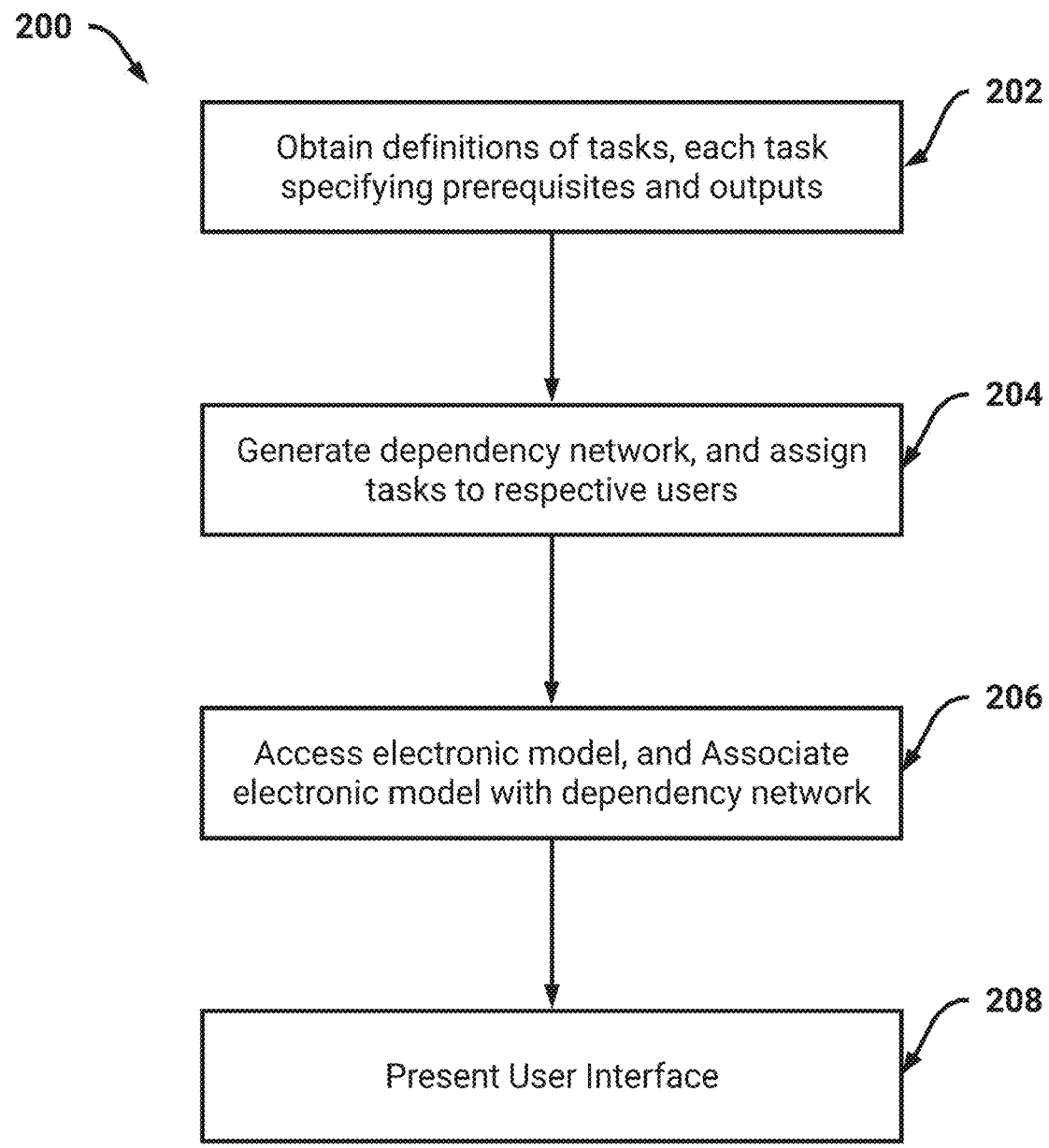
FIG. 2A illustrates a flowchart of an example process for presenting a dependency network.

FIG. 2A illustrates a flowchart of an example process 200 for presenting a dependency network. For convenience, the process 200 will be described as being performed by a system of one or more computers (e.g., the design optimization system 100).

At block 202, the system obtains definitions of tasks. As described in FIG. 1, a user can utilize a user interface to define tasks that will be included in the dependency network. For example, the user may indicate particular prerequisites associated with a task and outputs associated with the task. In some embodiments, the user may indicate information that a task requires and the system can determine prerequisites for the task. As an example, the user may indicate that a task requires locations of sewer piping in a building. Thus, the locations may be considered as an input to the task. The system may analyze the outputs, or deliverables, associated with tasks to determine one or more tasks that cause the sewer piping to be fully constructed.

At block 204, the system generates the dependency network. The system can analyze the prerequisites and outputs of the defined tasks, and determine dependencies among the tasks. For example, the system can utilize a business processing management (BPM) engine to generate the dependency network. As described in block 202, the system may determine and/or relate the deliverables of the tasks to inputs and/or a textual description of other tasks.

Additionally, the system may assign tasks to particular users. As an example, the definition of each task may indicate a user role that is authorized to perform the task. The system may therefore present information to users of a particular user role indicating assigned tasks.

At block 206, the system accesses an electronic model and associates the electronic model with the dependency network. The system can receive information indicating completion of particular tasks, and can then validate that the tasks were completed. For example, the system may access an electronic model indicating a current design of a structure. The system can then determine whether the design updates made to the electronic model based on a task are valid. As an example, the system can check whether sewage piping was designed to particular city codes, whether there are sufficient pipes or types of pipes for the structure, and so on.

At block 208, the system presents user interface information describing the dependency network. As described in FIG. 1, the system can cause presentation of user interfaces on user devices of users. The user interfaces can indicate pending tasks, tasks which are in progress, a representation of an electronic model (e.g., three-dimensional representation), and so on.

Figure 2B:
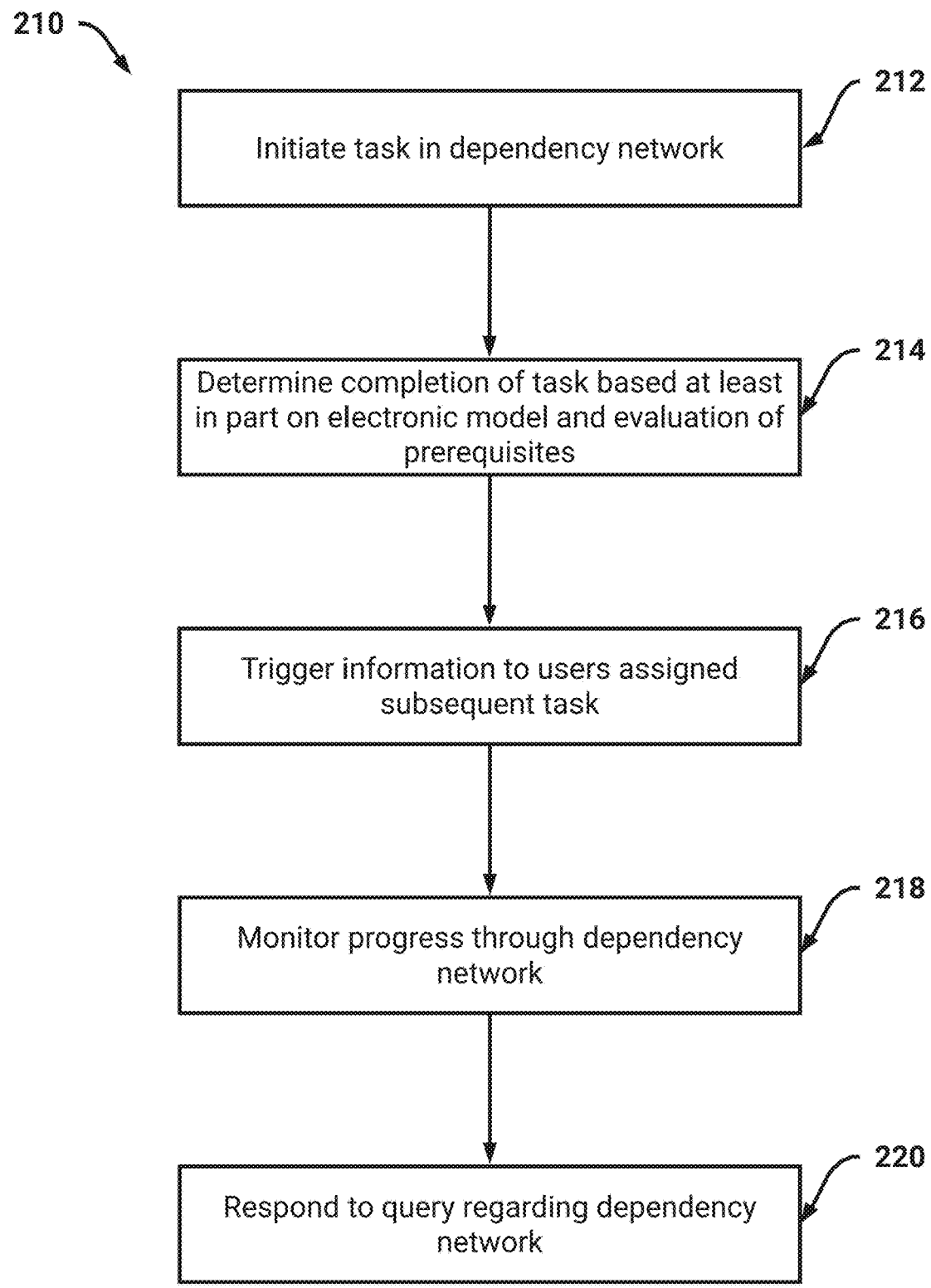
FIG. 2B illustrates a flowchart of an example process for monitoring progress through a dependency network.

FIG. 2B illustrates a flowchart of an example process 210 for monitoring progress through a dependency network. For convenience, the process 210 will be described as being performed by a system of one or more computers (e.g., the design optimization system 100).

At block 212, the system initiates a task in the dependency network. The system can enable initiation of a task based on completion of tasks that are prerequisites to the initiated task. For example, the system may validate that the prerequisite tasks were completed. Upon validation, the system can trigger notifications to users indicating that the task can be initiated.

At block 214, the system determines completion of the task. As described above, the system can validate completion of the task based on analyzing the electronic model in view of the prerequisites. Additionally, the task may indicate certain constraints which the design is to satisfy. Thus, the system may analyze the constraints and validate that the electronic model satisfies the constraints. For example, a constraint may relate to a number of employees who are meant to work on a particular floor of a building. The system can determine whether the number of employees could work on the floor based on the geometry of the design of the floor.

At block 216, the system triggers information to users assigned a subsequent task. After validating the task, the system can cause initiation of a subsequent (e.g., downstream) task. Particular users may be assigned the subsequent task as described above.

At block 218, the system monitors progress through the dependency network. The system can track the completed tasks, and present status information related to the design process. For example, the system may present user interface information describing the completed tasks, and updates made to the electronic model in response to each task. For example, a user interface may present tasks and a user may select a particular task. The system may update the user interface to highlight, shade, or otherwise call out, a portion of the electronic model that was updated by the particular task. In some embodiments, all tasks that were affected by the particular task may be differently highlighted in the electronic model.

At block 220, the system may, in some embodiments, respond to queries regarding the dependency network. Users may provide queries to interrogate particular aspects of the design process. For example, a user may provide a query requesting which task resulted in a particular object being included in the electronic model. As another example, a query may cause the system to estimate particular aspects of the electronic model. In this example, an estimate may relate to a quantity of rainwater which may be collected via a designed rainwater collection system.

Figure 3A:
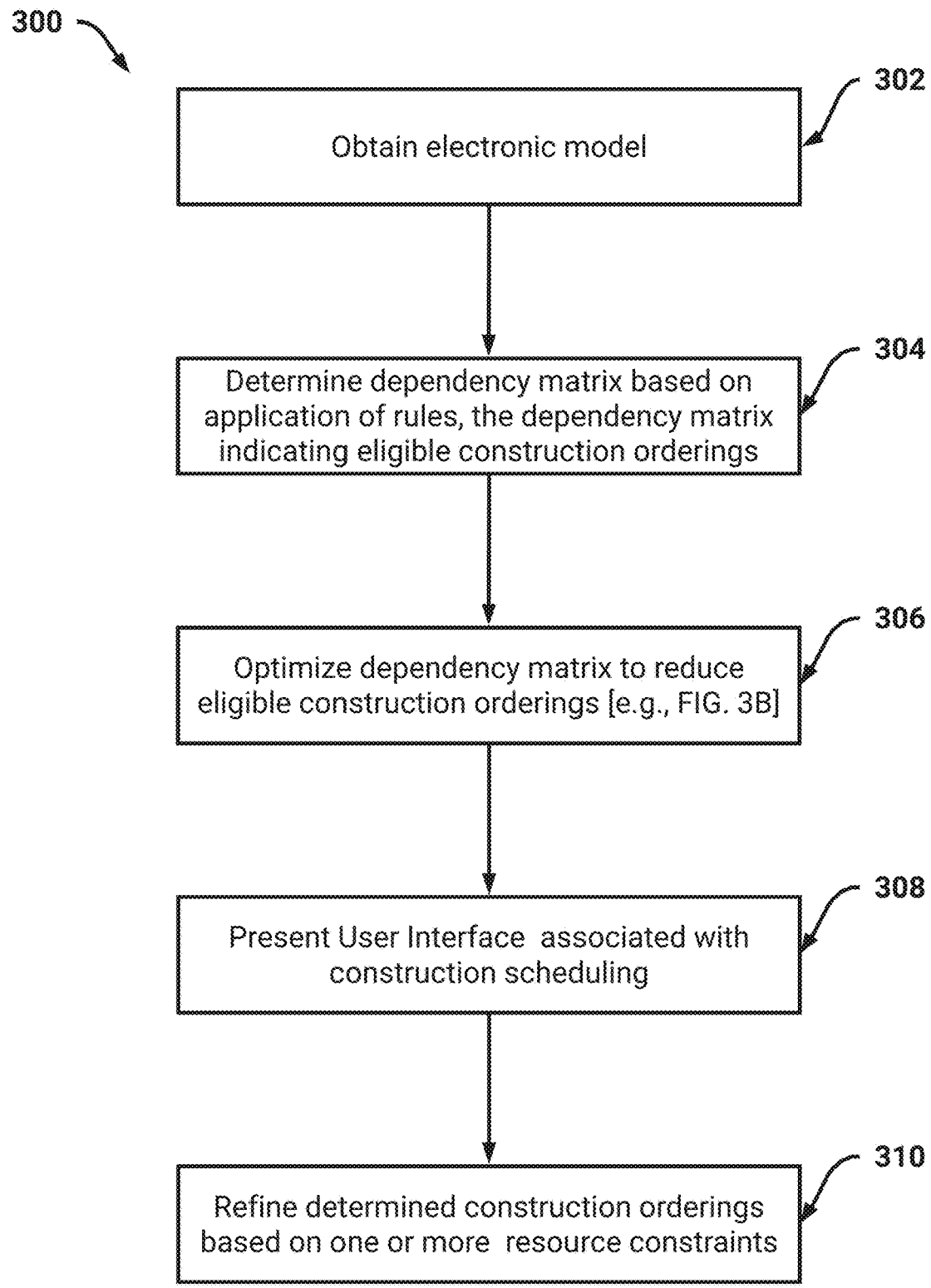
FIG. 3A illustrates a flowchart of an example process to present construction scheduling information.

FIG. 3A illustrates a flowchart of an example process 300 to present construction scheduling information. For convenience, the process 300 will be described as being performed by a system of one or more computers (e.g., the design optimization system 100).

At block 302, the system obtains an electronic model of a structure. As described above, the electronic model can indicate geometric information associated with included objects. Additionally, the electronic model can indicate other information (e.g., metadata), such as cost information associated with the objects, material information, and so on.

At block 304, the system determines a dependency matrix. The system can apply geometric algorithms to each object to establish relationships the object has with other objects. For example, a geometric algorithm can establish whether an object shares a coplanar surface or otherwise affects another object. For objects where a relationship exists, the system can determine whether a related object is related to another object, and so on. Thus, the system can generate dependencies (e.g., an order) associated with the objects. In the dependency matrix particular objects may represent leaf nodes, for example objects which no other object relies upon for a dependency. For objects where no relationship exists, the system can flag the objects as being orphans.

A non-limiting example of determining dependencies between slabs and columns. As described above, dependencies can be based on geometric measurements. For example, these measurements may, in some embodiments, be preferred over connection metadata (e.g., described in a BIM model). The dependencies may, in some embodiments, include dependences based on being above, below, beside (e.g., next to), co-planar, intersecting, co-planar within a threshold tolerance, and so on.

The system can determine that a slab will be dependent on a column if one or more of the following criteria are met. A bottom surface (e.g., the Z axis) of the slab is co-planar with a top surface of the column. A top of surface of the column intersects a solid defined by the slab geometry (e.g., the top of the column is embedded inside the slab). A top of the surface of the column is within a specified tolerance of being co-planar with the bottom surface of the slab. Any side surface of the slab (e.g., determined by a vertical orientation along the Z axis) is co-planar with a side surface of the column (e.g., determined by a vertical orientation along the Z axis). A solid defined by the geometry of the slab intersects with the solid defined by the geometry of the column unless the intersection is such that the bottom surface of the column (e.g., in the Z axis) is within the solid defined by the slab geometry.

The system can determine that a column will be dependent on a slab if one or more of the following criteria are met. A bottom surface (e.g., in the Z-axis) of the column is co-planar with a top surface (e.g., in the Z-axis) of the slab. The bottom surface of the column intersects the solid defined by the slab geometry (e.g., the bottom of the column is embedded inside the slab). The bottom surface of the column is within a threshold tolerance of being co-planar with the top surface of the slab.

Thus, for each object zero or more dependencies may be determined. From these determined dependencies, a dependency matrix can be generated. A construction ordering can be generated based on the dependency matrix. For example, an initial construction ordering may be devised based on dependencies generated above. Where no obvious dependencies between objects may exist (e.g., columns on a same floor of an electronic model), the initial construction ordering may, in some embodiments, be determined as follows. The electronic model can be oriented such that a longest axis of a bounding box of the electronic model is along a certain direction (e.g., the Y-axis) and an origin is set to be a center point of the bounding box. For each floor of the structure, the system can start in a particular corner (e.g., the north east corner of the bounding box of the structure, such as maximum X and maximum Y), and scan along a particular direction (e.g., South, such as by reducing the Y axis) adding the objects into the construction ordering as they are encountered. If the system is at the minimum of the particular direction (e.g., minimum Y of the bounding box), the system scans in a different direction (e.g., westward, thus reducing X) and the scan can resume along the opposite of the particular direction (e.g., increasing Y) adding objects into the construction ordering as they are encountered. The system can then repeat the scan (e.g., north to south, east to west) until the entire floor of the structure has been scanned.

At block 306, the system optimizes the dependency matrix to reduce eligible construction orderings. As described in block 304, the system determines construction orderings that satisfy determined dependencies. To reduce the number of possible construction orderings, and thus to conserve memory and processing power, the system may eliminate construction orderings not likely to be selected. While the description herein has focused on removing construction orderings according to directionality, it should be understood that additional techniques may be utilized (e.g., ensuring construction orderings comport with times at which particular resources are available).

At block 308, the system presents user interface information associated with construction scheduling. As described in FIG. 1, the system can present information indicating the determined construction orderings. For example, the system may present a construction ordering that results in a lowest construction time, lowest cost, or a combination thereof. The user interface may also present visualizations of a construction ordering. For example, the user interface may present an animation illustrating a progression of objects being constructed.

At block 310, the system may, in some embodiments, refine determined construction orderings based on one or more resource constraints. The system may receive (e.g., via user input) one more constraints associated with construction time, cost, resource usage, and so on. The system may adjust a construction order, for example the construction order described in block 308, to satisfy the constraints. As an example, the system may select a construction order that results in a construction time less than a constraint-identified construction time. As another example, the system may receive information during construction that indicates reduced access to particular resources for a period of time. The system may then determine an updated construction ordering that delays construction of objects that utilize the particular resources.

Figure 3B:
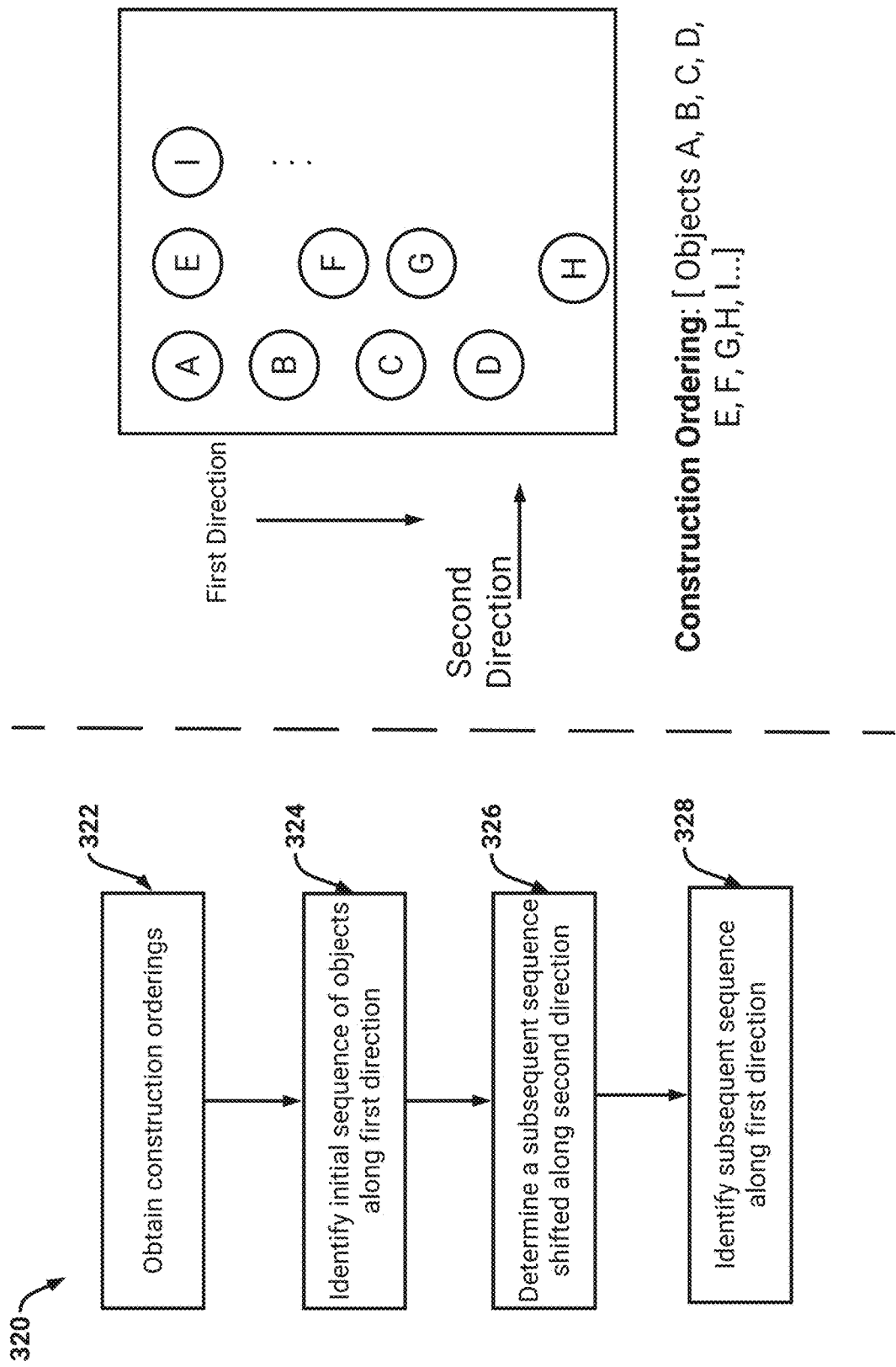
FIG. 3B illustrates a flowchart of an example process to determine a construction ordering that satisfies directionality requirements.

FIG. 3B illustrates a flowchart of an example process 320 to determine a construction ordering that satisfies directionality requirements. For convenience, the process 320 will be described as being performed by a system of one or more computers (e.g., the design optimization system 100).

At block 322, the system obtains determined construction orderings. As described above in FIG. 3A, the system can determine construction orderings that satisfy particular directionality constraints using a determined dependency matrix. Additionally, the system can determine all possible construction orderings (e.g., via the dependency matrix), and filter the construction orderings based on directionality constraints.

At block 324, the system identifies an initial sequence of objects along a first direction. FIG. 3B illustrates (e.g., in the right portion) example objects (e.g., objects A-I). The system can traverse the dependency matrix and identify that objects A-D can be constructed.

At block 326 the system determines a subsequent sequence shifted along a second (e.g., orthogonal) direction. As illustrated, the system has determined that object E is shifted in the second direction. The system may shift along the second direction until identifying a position in the second direction that is in line with an object in the first direction.

At block 328, the system determines a sequence along the first direction. As illustrated, the system has determined that objects E-H can be included in the construction ordering.

Figure 3C:
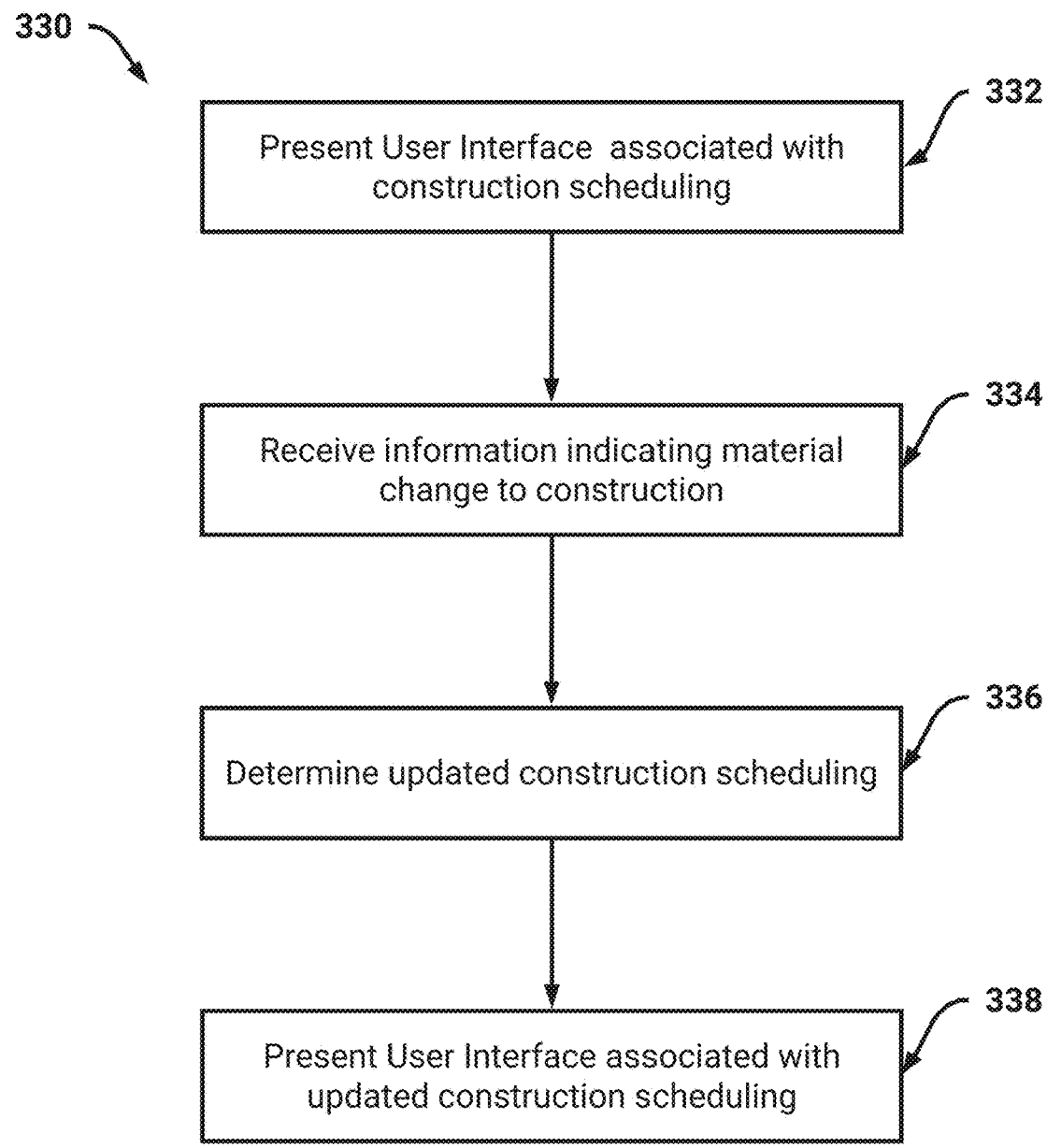
FIG. 3C illustrates a flowchart of an example process to update a construction scheduling based on a material change to a design.

FIG. 3C illustrates a flowchart of an example process 330 to update a construction scheduling based on a material change to a design. For convenience, the process 330 will be described as being performed by a system of one or more computers (e.g., the design optimization system 100).

At block 332, the system presents user interface information associated with a construction ordering being constructed by a construction entity. At block 334, the system receives information indicating a material change to the design. As described in FIG. 1, the material change may relate to a new portion of the design, modifying a portion of the design, or handling an improperly constructed portion of the design. At block 336, the system determines an updated construction ordering and at block 338 the system presents user interface information associated with the updated construction ordering.

In some embodiments, the material change may cause one or more tasks associated with designing an electronic model to be updated or performed again. For example, the material change may relate to the updating of a particular portion of a corresponding structure. In this example, the system may identify tasks associated with designing portion. The system may then trigger that these tasks be performed again to satisfy the material change. Thus, the material change may represent a constraint associated with designing the structure.

Figure 4A:
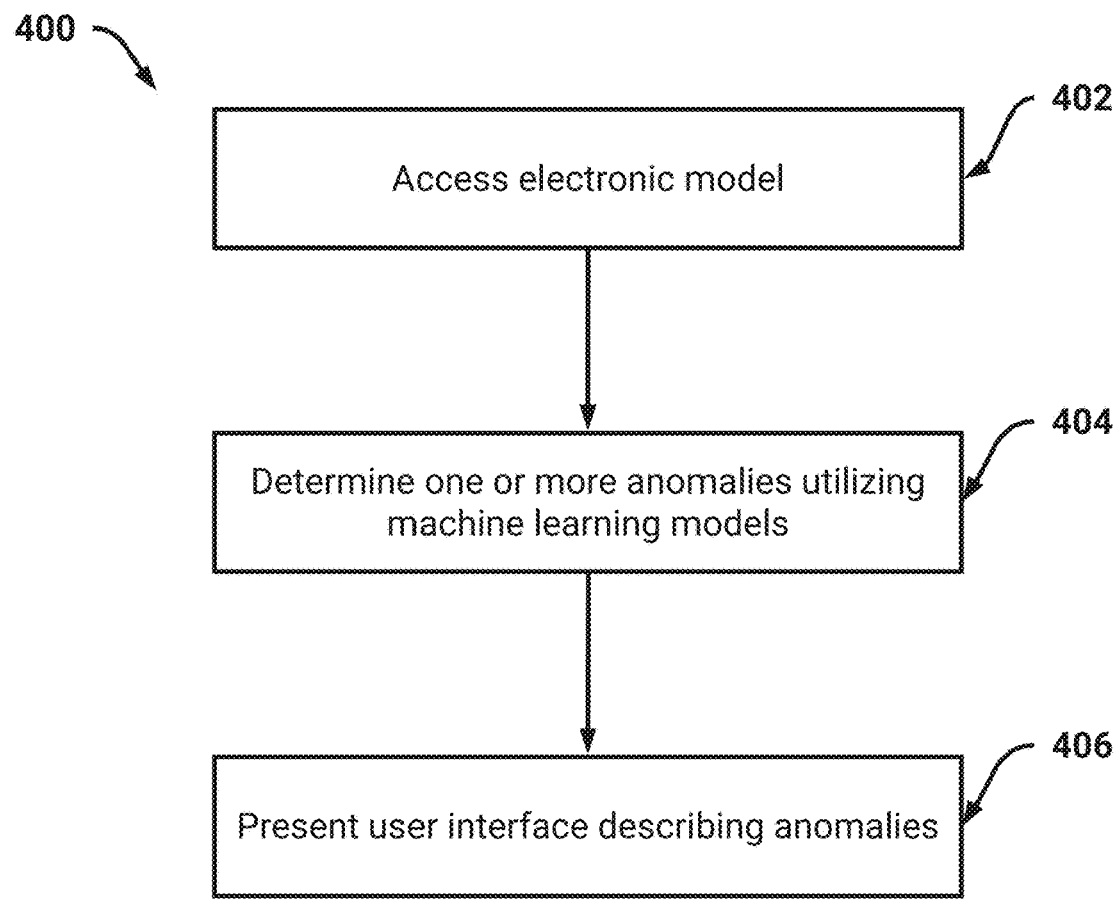
FIG. 4A illustrates a flowchart of an example process to determine anomalies in an electronic model.

FIG. 4A illustrates a flowchart of an example process 400 to determine anomalies in an electronic model. For convenience, the process 400 will be described as being performed by a system of one or more computers (e.g., the design optimization system 100).

At block 402, the system accesses an electronic model of a structure. As described above, the system can enable generation of a design process to design the structure. The system can then access (e.g., from a database, or via a network) the electronic model.

At block 404, the system determines one or more anomalies using machine learning techniques. As described above, the system may utilize machine learning techniques based on unsupervised or supervised learning. Some examples follow; however, these examples should not be considered exhaustive. The system can utilize supervised learning to analyze electronic models for indications of uniqueness. For example, an electronic model can be converted, or represented, as a table of objects. The table can include different columns of values for each object. The system can analyze the table to identify groups of similar characteristics (e.g., values of columns) for a set of objects. The system may subdivide the objects until a unique object is located. The system can then assign this object as being anomalous. That is, the object may be the most dissimilar from the remaining objects. The system may subdivide the objects, in some embodiments, based on specific characteristics, such as a slenderness ratio (e.g., proportionality of width and height for each object).

An example rationale for the above-described approach is that anomalies may be more meaningful, or discernible, when taken in context of their local surroundings rather than the electronic model as a whole. The repeated categorical splitting isolates product groups and anomalies may thus appear as 'leaves' at the base of a tree. For example, the splitting may generate one or more clusters comprising a single product which may be different from all others in a local vicinity. An example of this process is described below, with respect to FIG. 5A.

The system may optionally utilize properties of objects, such as size information, material composition, orientation information, weight information, and so on. In some embodiments, the system may utilize machine learning techniques with respect to specific rooms or building types. With respect to the example of a room, the system may learn to identify anomalous objects in a same type of room regardless of a type of structure the room is included in. For example, the system may learn to identify anomalous features of a bathroom or shower regardless of whether the bathroom or shower is included in a hospital, stadium, or research facility. Additionally, when determining anomalous objects, the system may utilize information associated with a design grid and locations of objects within the design grid. Thus, the system may learn to identify objects which are not substantially positioned on the design grid (e.g., off-grid objects).

As another example, the system may utilize one or more neural networks. In this example, a neural network may be trained based on ingested electronic models. It may be appreciated that training data may comprise information from different structures (e.g., buildings, infrastructure projects, and so on). Thus, the training data may reflect information from skyscrapers being built and also information from sports arenas, subway stations, and so on. These electronic models may be converted into respective data structures, such as tables of objects along with associated relationships (e.g., spatial relationships) between the objects. Optionally, additional information associated with objects may be utilized (e.g., material composition, size information, additional metadata, and so on). In some embodiments, localized portions of electronic models may be utilized. As an example, it may be appreciated that when analyzing images a neural network (e.g., a convolutional neural network) may ingest patches (e.g., sub-portions) of training images. Similarly, the neural network may be trained utilizing sub-portions of an entire electronic model.

Label information may be provided indicating the existence, or absence, of anomalies. Optionally, types of anomalies may be identified. Example types of anomalies may include, a column improperly rotated, a column moved off a grid, a column section size altered, a beam or bracing improperly rotated, moved, improper orientation of objects, improper connectivity or elevation, improper material composition, improperly oriented valves or ductworks, and so on. Due to the breadth of training data, such as different structures and infrastructure designs, the neural networks may learn to extract anomalous features which, as an example, other machine learning techniques may miss. For example, a neural network may learn to apply certain extracted features or rules from a first type of electronic design (e.g., hospitals) to a second type of electronic design (e.g., sports stadiums).

In some embodiments, a neural network may comprise one or more dense layers (e.g., fully connected layers). For example, this neural network may receive training information encoded into a data structure as described above. The neural network may be associated with one or more loss functions which cause the network to update based on certain objects being labeled anomalous. In some embodiments, a convolutional neural network may be leveraged. For example, the convolutional neural network may apply multitudes of convolutional layers to the image information generated from an electronic model. Thus, the convolutional neural network may learn to identify the geometric information which leads to an object being considered anomalous. Optionally, a recurrent neural network may be utilized to ascertain a probability of a sequence of objects (e.g., a sequence of objects connected along one or more axes) as being correct. This network may learn to assign a probability associated with a sequence, and may optionally learn to recommend, or replace, objects included in a sequence.

With respect to unsupervised learning (e.g., optionally characterized as brute force learning), the system may use the characteristics, or features, of each object (e.g., component) as the basis for splitting (e.g. creating groups through splits). The electronic model may be split into component categories (e.g., walls, slabs, columns, and so on). The resulting groups may then be split against one or other characteristics based on a set of criteria in relation to characteristic and characteristic value instances in a model. Splitting may be repeated until one or more unique component characteristics or characteristic values are found. These unique component characteristics or characteristic values may be identified as outliers, and thus potentially anomalous.

In some embodiments, techniques which pre-process a model may be utilized. In these techniques, adjacencies between components, such as 'attached', 'touching', 'coplanar faces' or other, may be identified. For example, the system may analyze spatial relationships via participation of a component along with a number of instances of the component in a space (e.g., of a certain type) and the dimensions of that space. The system may also utilize functional relationships. For example, the system may utilize information indicating lights and windows in an electronic model. In this example, it may be appreciated that greater than a threshold number of lights close to a window may be characterized as anomalous.

Based on pre-processing, a model may thus be extended. An example of this could be that a column component has a geometric representation and associated metadata (e.g., structural information, thermal transmittance, and so on). Pre-processing a model may allow the addition of new metadata/characteristics. Example metadata/characteristics may include a distance to sibling (e.g., sibling object, such as neighbor object or object of a same type), whether an object is connected to other object classes, and so on. This may enrich the model and, for example, increase the points of comparison which may be utilized to isolate issues against. Optionally, these points of comparison may be utilized to identify an anomaly.

Figure 4B:
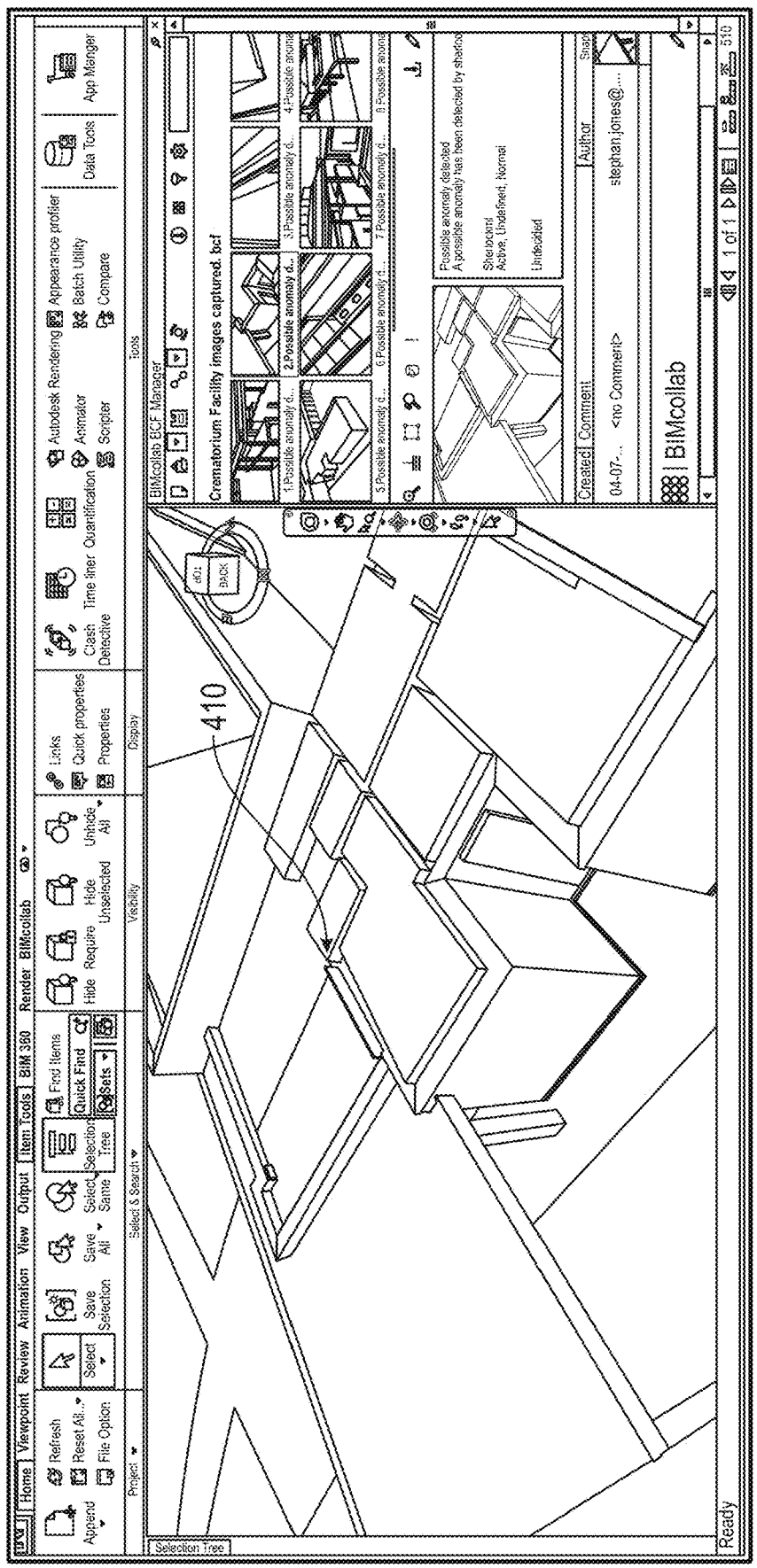
FIG. 4B illustrates an example anomaly determined by the system.

At block 406, the system presents user interface information describing the determined anomalies. As described in FIG. 1, the system may present a graphical representation of the electronic model with any determined anomalies highlighted. Additionally, the system may trigger updates be made to the electronic model (e.g., trigger one or more new tasks). For example, FIG. 4B illustrates an example anomaly 410 determined by the system. Advantageously, these determined anomalies may be presented in design software preferred by a user. As an example, the techniques described herein may advantageously integrated into different design software.

Figure 5A:
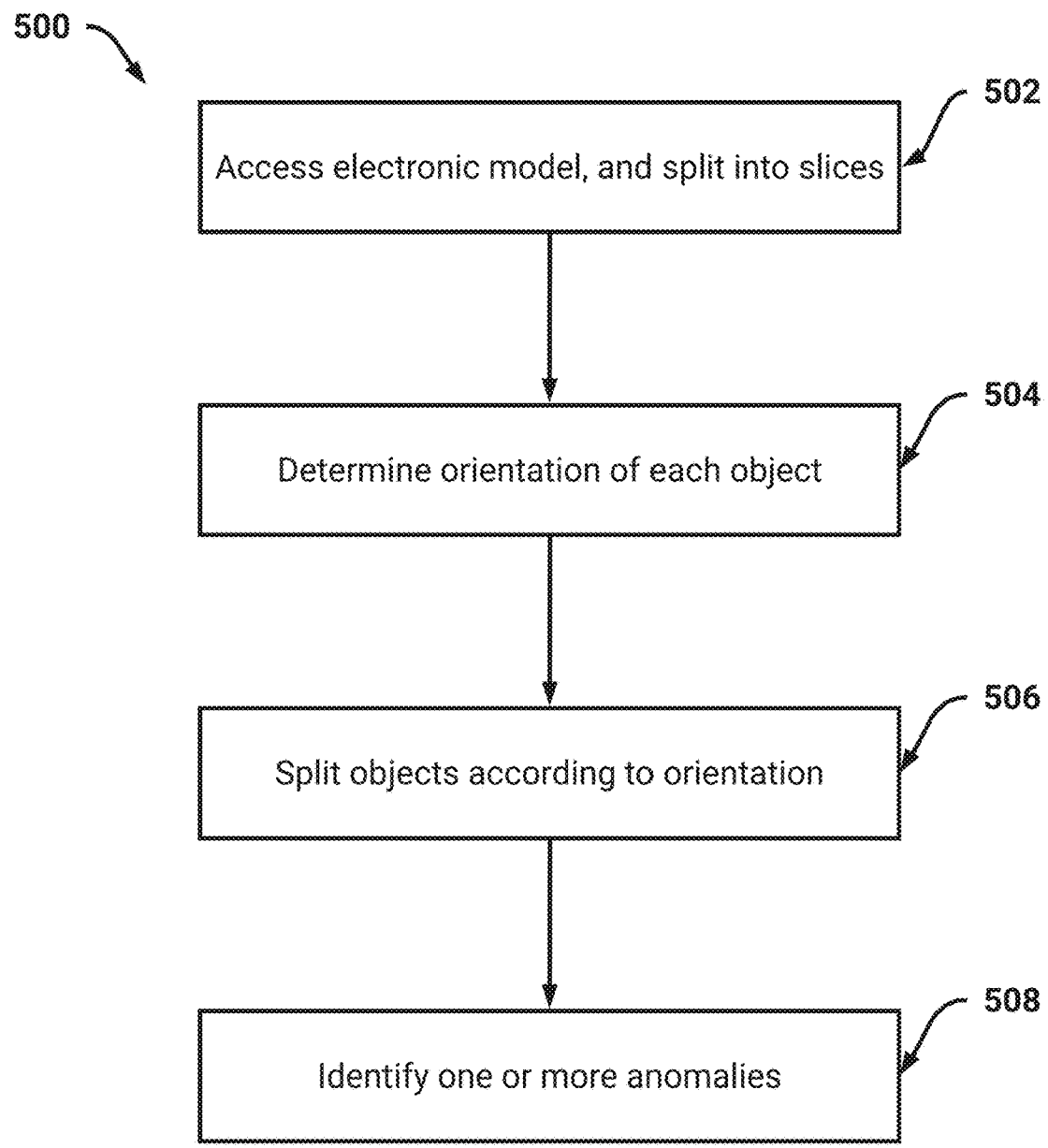
FIG. 5A is a flowchart of an example process for identifying an anomaly in an electronic model
Figure 5B:
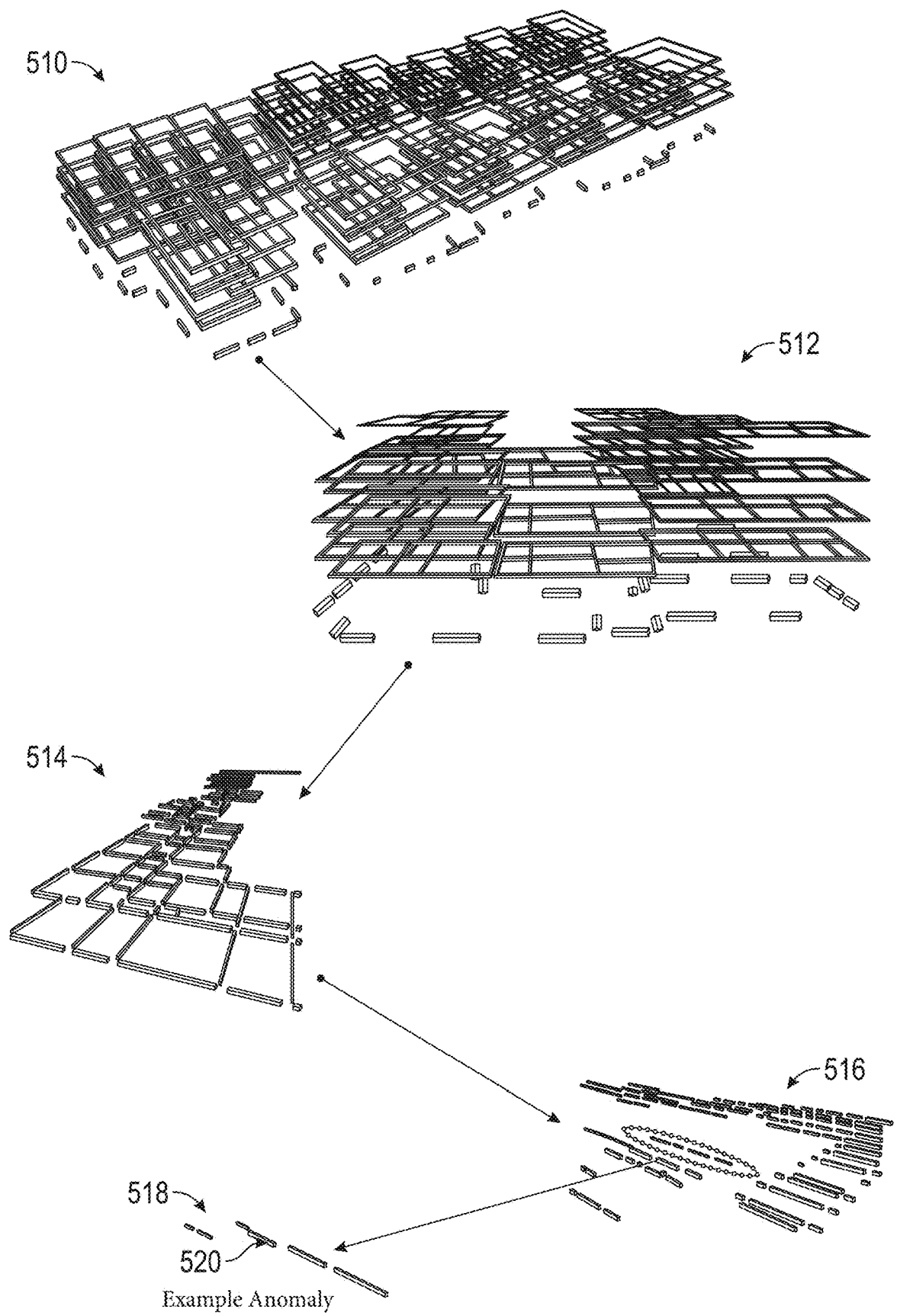
FIG. 5B illustrates a graphical representation of the steps in an example categorical anomaly detection scheme.

FIG. 5A is a flowchart of an example process 500 for determining an example anomaly in an electronic model. For convenience, the process 500 will be described as being performed by a system of one or more computers (e.g., the design optimization system 100). Reference will be made throughout the description of FIG. 5A to the illustrated of FIG. 5B. FIG. 5B illustrates a graphical representation of the steps in an example categorical anomaly detection scheme.

For example, FIG. 5A describes an example scheme which utilizes an electronic model (e.g., space in which model objects are defined) and repeatedly splits model objects into clusters (e.g., groups) based on values of a set of discrete variables. The example scheme can thus cause generation of a tree of clusters with each node representing a split on a given discrete variable. As described above, the rationale for this approach may be that anomalies are more meaningful or discernible when taken in context of its local surroundings rather than the model as a whole. The repeated categorical splitting isolates product groups, and thus anomalies may appear as 'leaves' at the base of the tree. For example, the leaves may be clusters containing only a single object (e.g., different from all others in a local vicinity).

At block 502, the system accesses an electronic model and splits an electronic model into slices. For example, and as illustrated in portion 512 of FIG. 5B, the system may split the model 510 in the z-direction (e.g., the model 510 is colored according to slices in the z-direction). The electronic model may be ingested (e.g., an IFC file may be read), and then split vertically in the z-direction into layers.

At block 504, the system determines an orientation of each object. For example, for each z-slice the system calculates the orientation of each object relative to a global coordinate axes. As illustrated in portion 514, the orientations may be presented in a user interface with distinct coloring. In this way, a user of the user interface may rapidly ascertain orientations of the objects included in the electronic model.

At block 506, the system splits the objects according to orientation. Portion 516 of FIG. 5B illustrates an example of the results of an example split. Each layer may then be split by its orientation split, and rotated to an axis-parallel basis and split into clusters on the values of the X and/or Y coordinates. In some embodiments, the splitting on the values of the X and Y coordinates may be performed separately (e.g., successively). For example, portion 516 illustrates clustering on example objects in the X and Y coordinates. An example of a cluster, for example found by grouping based on X values, is shown circled in portion 516.

At block 508, the system identifies an example anomaly 520. For example, the system can cluster on a direction again (e.g., the X direction) within a cluster. The system can then identify an anomaly, or optionally continue clustering. For example, portion 518 illustrates an example anomaly 520 (e.g., highlighted in yellow) which is off-axis relative to its neighbors. Further splitting on X and Y within each subcluster can reveal anomalies at the base of the tree.

The process described in FIG. 5A may isolate anomalies where an object is off-axis relative to its neighbors in the X-direction. Changing the order in which the splits are carried out allows detection of other kinds of anomalies. As an example, splitting on orientation last may find anomalies with flipped orientation in a cluster. As another example, splitting in the Y-direction may detect off-axis anomalies in the Y-direction. In general all split combinations of splittings may be generated, and anomalies identified in a bottom layer.

This supervised component of this model may utilize labeled data to refine the predictions. While FIGS. 5A-5B may, as an example, be initially focused on the physical orientation and dimensions of components (e.g., objects), all other characteristics may be utilized to assess the uniqueness of a component to determine whether it is anomalous.

In addition to the raw model data, the system may employ specialist geometric algorithm libraries. For example, these libraries may be used to generate adjacency definitions of each component to those immediate to it and optionally to its nearest sibling (equivalent class). This may be sub categorized as to interface type such as 'touching' or 'measured separation', in addition to top, side and bottom adjacencies. In this way, these relationships may further enhance the ability to test for uniqueness in a spatial-categorical manner.

Other Embodiments

Throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions, and changes in the form of the methods, apparatus, and systems described herein may be made without departing from the spirit of the disclosure. For example, circuit blocks and/or circuit elements described herein may be deleted, moved, added, subdivided, combined, and/or modified. Each of these circuit blocks and/or circuit elements may be implemented in a variety of different ways. The accompanying claims and their equivalents are intended to cover any such forms or modifications as would fall within the scope and spirit of the disclosure.

What is claimed is:

1. A system comprising one or more processors and non-transitory computer storage media storing instructions that when executed by the one or more processors, cause the processors to perform operations, the operations enabling user efficiency improvements with respect to determining an order in which to construct physical objects, and the operations enabling improvements to updating of an electronic model, the operations comprising:
    obtaining an electronic model, the electronic model comprising a plurality of objects, the objects representing physical objects to be constructed, and the electronic model being of a structure or infrastructure project;
    determining dependencies between the objects, wherein the determined dependencies indicate, at least, that a first object is to be constructed prior to a second object;
    generating a plurality of construction orderings based on the determined dependencies, each construction ordering indicating a unique order in which the objects are to be constructed, wherein a subset of the generated construction orderings are retained based on the subset causing the objects to be constructed according to a particular geometric pattern; and
    causing presentation, via a user device, of user interface information describing the subset of the construction orderings, wherein the system is configured to trigger updates to the electronic model in response to received material changes associated with the electronic model.

2. The system of claim 1, wherein the particular geometric pattern is with respect to a plurality of geographic directions.

3. The system of claim 1, wherein the operations further comprise:
    receiving information indicating a material change to a design associated with the electronic model;
    determining at least one updated construction ordering; and
    causing presentation of information associated with the updated construction ordering.

4. The system of claim 3, wherein the material change indicates an improper construction of a particular object.

5. The system of claim 1, wherein the operations further comprise:
    receiving information indicating a material change, the material change comprising a constraint identifying a threshold construction time associated with the structure or infrastructure project;
    determining simulated times to complete the subset of the construction orderings; and
    based on a determination that the simulated times are greater than the threshold construction time, triggering an update to a design of the electronic model.

6. The system of claim 1, wherein the system triggers an update to the electronic model based on receipt of a material change, and wherein the operations further comprise:
 accessing a precedence network associated with designing the electronic model, the precedence network identifying dependencies among tasks performed to design the electronic model, and wherein respective tasks are associated with portions of the electronic model designed in response to completion of the tasks;
 identifying, based on the material change, one or more tasks to be updated, wherein the material change is with respect to a portion of the electronic model designed based on the identified tasks; and
 transmitting notifications to one or more users identifying the identified tasks.

7. The system of claim 1, wherein the operations further comprise:
 determining one or more anomalies within the electronic model, wherein each anomaly relates to an object and wherein determining the anomalies is based on application of one or more machine learning models and adjacency relationships between objects in three-dimensional space; and
 causing presentation of information describing the anomalies.

8. The system of claim 7, wherein the information describing the anomalies comprises a graphical representation of the electronic model, and wherein the graphical representation comprises the determined anomalies highlighted in the graphical representation.

9. A method comprising:
 by a system of one or more processors,
 obtaining an electronic model, the electronic model comprising a plurality of objects, the objects representing physical objects to be constructed, and the electronic model being of a structure or infrastructure project;
 determining dependencies between the objects, wherein the determined dependencies indicate, at least, that a first object is to be constructed prior to a second object;
 generating a plurality of construction orderings based on the determined dependencies, each construction ordering indicating a unique order in which the objects are to be constructed, wherein a subset of the generated construction orderings are retained based on the subset causing the objects to be constructed according to a particular geometric pattern; and
 causing presentation, via a user device, of user interface information describing the subset of the construction orderings, wherein the system is configured to trigger updates to the electronic model in response to received material changes associated with the electronic model.

10. The method of claim 9, wherein the geometric pattern is with respect to a plurality of geographic directions.

11. The method of claim 9, further comprising:
 receiving information indicating a material change, the material change comprising a constraint identifying a threshold construction time associated with the structure or infrastructure project;
 determining simulated times to complete the subset of the construction orderings; and
 based on a determination that the simulated times are greater than the threshold construction time, triggering an update to a design of the electronic model.

12. A method comprising:
 by a system of one or more processors,
 obtaining an electronic model, the electronic model comprising a plurality of objects, the objects representing physical objects to be constructed, and the electronic model being of a structure or infrastructure project;
 determining dependencies between the objects, wherein the determined dependencies indicate, at least, that a first object is to be constructed prior to a second object;
 generating one or more construction orderings based on the determined dependencies, each construction ordering indicating a unique order in which the objects are to be constructed; and
 causing presentation, via a user device, of user interface information describing the construction orderings, wherein the system is configured to trigger updates to the electronic model in response to received material changes associated with the electronic model, and wherein the method further comprises:
 receiving information indicating a material change to a design associated with the electronic model;
 determining at least one updated construction ordering; and
 causing presentation of information associated with the updated construction ordering.

13. The method of claim 12, wherein the material change indicates an improper construction of a particular object.

14. The method of claim 9, A method comprising:
 by a system of one or more processors,
 obtaining an electronic model, the electronic model comprising a plurality of objects, the objects representing physical objects to be constructed, and the electronic model being of a structure or infrastructure project;
 determining dependencies between the objects, wherein the determined dependencies indicate, at least, that a first object is to be constructed prior to a second object;
 generating one or more construction orderings based on the determined dependencies, each construction ordering indicating a unique order in which the objects are to be constructed; and
 causing presentation, via a user device, of user interface information describing the construction orderings, wherein the system triggers an update to the electronic model based on receipt of a material change, and wherein the method further comprises:
 accessing a precedence network associated with designing the electronic model, the precedence network identifying dependencies among tasks performed to design the electronic model, and wherein respective tasks are associated with portions of the electronic model designed in response to completion of the tasks;
 identifying, based on the material change, one or more tasks to be updated, wherein the material change is with respect to a portion of the electronic model designed based on the identified tasks; and
 transmitting notifications to one or more users identifying the identified tasks.

15. A method comprising:
 by a system of one or more processors,
 obtaining an electronic model, the electronic model comprising a plurality of objects, the objects representing physical objects to be constructed, and the electronic model being of a structure or infrastructure project;
 determining dependencies between the objects, wherein the determined dependencies indicate, at least, that a first object is to be constructed prior to a second object;
 generating one or more construction orderings based on the determined dependencies, each construction ordering indicating a unique order in which the objects are to be constructed; and causing presentation, via a user device, of user interface information describing the construction orderings, wherein the system is configured to trigger updates to the electronic model in response to received material changes associated with the electronic model, wherein the method further comprises:

determining one or more anomalies within the electronic model, wherein each anomaly relates to an object and wherein determining the anomalies is based on application of one or more machine learning models and adjacency relationships between objects in three-dimensional space; and causing presentation of information describing the anomalies.

16. The method of claim 15, wherein the information describing the anomalies comprises a graphical representation of the electronic model, and wherein the graphical representation comprises the determined anomalies highlighted in the graphical representation.

17. Non-transitory computer storage media storing instructions that when executed by a system of one or more processors, cause the processors to perform operations, the operations enabling improvements in determining anomalies in electronic models, the improvements being based on insights extracted from machine learning models trained on disparate electronic models of structures and/or infrastructure projects, and the method comprising:

obtaining an electronic model, the electronic model comprising a plurality of objects, and the objects representing physical objects to be constructed, and the electronic model being of a structure or infrastructure project;

determining one or more anomalies within the electronic model, wherein each anomaly relates to an object wherein determining the anomalies is based on application of one or more machine learning models and adjacency relationships between objects in three-dimensional space, and wherein the machine learning models were trained using data from different types of structures and/or infrastructure projects; and causing presentation, via a user device, of user interface information describing anomalous objects included in the electronic model, the anomalous objects being determined via application of one or more machine learning models.

18. The computer storage media of claim 17, wherein the operations further comprise:

wherein the information describing the anomalies comprises a graphical representation of the electronic model, and wherein the graphical representation comprises the determined anomalies highlighted in the graphical representation.

19. The computer storage media of claim 17, wherein the operations further comprise:

receiving a material change associated with the electronic model; and triggering an update to the electronic model.

20. The computer storage media of claim 17, wherein the operations further comprise:

accessing a precedence network associated with designing the electronic model, the precedence network identifying dependencies among tasks performed to design the electronic model, and wherein respective tasks are associated with portions of the electronic model designed in response to completion of the tasks;

identifying, based on the material change, one or more tasks to be updated, wherein the material change is with respect to a portion of the electronic model designed based on the identified tasks; and transmitting notifications to one or more users identifying the identified tasks.

* * * * *